(12) United States Patent  (10) Patent No.: US 9,220,067 B2
Khlat et al.  (45) Date of Patent: *Dec. 22, 2015

(54) FRONT END RADIO ARCHITECTURE (FERA) WITH POWER MANAGEMENT

(71) Applicant: RF Micro Devices, Inc., Greensboro, NC (US)

(72) Inventors: Nadim Khlat, Cugnaux (FR); Alexander Wayne Hietala, Phoenix, AZ (US)

(73) Assignee: RF Micro Devices, Inc., Greensboro, NC (US)

( * ) Notice: Subject to any disclaimer, the term of this patent is extended or adjusted under 35 U.S.C. 154(b) by 82 days.

This patent is subject to a terminal disclaimer.

(21) Appl. No.: 14/051,601

(22) Filed: Oct. 11, 2013

(65) Prior Publication Data

US 2014/0038675 A1  Feb. 6, 2014

Related U.S. Application Data

(63) Continuation-in-part of application No. 13/460,861, filed on May 1, 2012, now Pat. No. 8,774,065.

(60) Provisional application No. 61/712,425, filed on Oct. 11, 2012, provisional application No. 61/481,311, filed on May 2, 2011.

(51) Int. Cl.
*H04B 7/00* (2006.01)
*H04W 52/02* (2009.01)
(Continued)

(52) U.S. Cl.
CPC ......... *H04W 52/0251* (2013.01); *H03F 1/0227* (2013.01); *H03F 3/24* (2013.01); *H03F 3/68* (2013.01); *H03F 3/72* (2013.01); *H04B 1/0067* (2013.01); *H04L 5/001* (2013.01);
(Continued)

(58) Field of Classification Search
CPC ..................... H03F 2200/451; H04W 52/0251
USPC ......................................................... 370/277
See application file for complete search history.

(56) References Cited

U.S. PATENT DOCUMENTS 4,498,057 A * 2/1985 Noro ............................ 330/297
5,502,422 A   3/1996 Newell et al.
(Continued)

OTHER PUBLICATIONS

Notice of Allowance for U.S. Appl. No. 13/460,861, mailed Jan. 30, 2014, 9 pages.
(Continued)

*Primary Examiner* — Andrew Lai
*Assistant Examiner* — Jamaal Henson
(74) *Attorney, Agent, or Firm* — Withrow & Terranova, P.L.L.C.

(57) ABSTRACT

A front end radio architecture (FERA) with power management is disclosed. The FERA includes a first power amplifier (PA) block having a first-first PA for amplifying first-first signals and a first-second PA for amplifying first-second signals. Also included is a second PA block having a second-first PA for amplifying second-first signals and a second-second PA for amplifying second-second signals. At least one power supply is adapted to selectively supply power to the first-first PA and the second-second PA through a first path. The power supply is also adapted to selectively supply power to the first-second PA and the second-first PA through a second path. A control system is adapted to selectively enable and disable the first-first PA, the first-second PA, the second-first PA, and the second-second PA.

22 Claims, 17 Drawing Sheets

(51) Int. Cl.
*H03F 1/02* (2006.01)
*H03F 3/24* (2006.01)
*H03F 3/68* (2006.01)
*H03F 3/72* (2006.01)
*H04B 1/00* (2006.01)
*H04L 5/00* (2006.01)
*H04B 1/04* (2006.01)

(52) U.S. Cl.
CPC . *H03F2203/7209* (2013.01); *H03F 2203/7221* (2013.01); *H04B 2001/045* (2013.01)

(56) References Cited

U.S. PATENT DOCUMENTS

| | | | |
|---|---|---|---|
| 5,610,553 | A | 3/1997 | Kirn |
| 6,091,970 | A | 7/2000 | Dean |
| 6,128,474 | A | 10/2000 | Kim et al. |
| 6,389,269 | B1 | 5/2002 | Nanni et al. |
| 6,405,018 | B1 | 6/2002 | Reudink et al. |
| 7,187,945 | B2 | 3/2007 | Ranta et al. |
| 7,212,788 | B2 | 5/2007 | Weber et a |
| 7,251,499 | B2 | 7/2007 | Ellä et al. |
| 7,486,133 | B2 | 2/2009 | Bakalski |
| 7,728,661 | B2 | 6/2010 | Bockelman et al. |
| 7,864,491 | B1 | 1/2011 | Bauder et al. |
| 7,872,547 | B2 | 1/2011 | Song et al. |
| 7,893,790 | B2 | 2/2011 | Van Delden |
| 7,973,645 | B1 | 7/2011 | Moretti et al. |
| 7,996,003 | B2 | 8/2011 | Maeda et al. |
| 8,174,315 | B1 | 5/2012 | Mangold et al. |
| 8,208,867 | B2 | 6/2012 | Lum et al. |
| 8,437,438 | B2 | 5/2013 | Kuwahara |
| 8,565,701 | B2 | 10/2013 | Sanchez et al. |
| 8,571,489 | B2 | 10/2013 | Mikhemar et al. |
| 8,634,029 | B2 | 1/2014 | Pugel |
| 8,718,582 | B2 | 5/2014 | See et al. |
| 8,774,065 | B2 | 7/2014 | Khlat et al. |
| 8,774,067 | B2 | 7/2014 | Rousu et al. |
| 2005/0245202 | A1 | 11/2005 | Ranta et al. |
| 2005/0277387 | A1 | 12/2005 | Kojima et al. |
| 2006/0012425 | A1* | 1/2006 | Ohnishi et al. ............... 330/126 |
| 2006/0025171 | A1 | 2/2006 | Ly et al. |
| 2006/0240785 | A1 | 10/2006 | Fischer |
| 2006/0276132 | A1 | 12/2006 | Sheng-Fuh et al. |
| 2006/0293005 | A1 | 12/2006 | Hara et al. |
| 2007/0280185 | A1 | 12/2007 | McFarland et al. |
| 2008/0003797 | A1 | 1/2008 | Kim |
| 2009/0180403 | A1* | 7/2009 | Tudosoiu ...................... 370/278 |
| 2009/0286501 | A1 | 11/2009 | Rousu et al. |
| 2009/0303007 | A1 | 12/2009 | Ryou et al. |
| 2010/0079347 | A1 | 4/2010 | Hayes et al. |
| 2010/0099366 | A1 | 4/2010 | Sugar et al. |
| 2010/0248660 | A1 | 9/2010 | Bavisi et al. |
| 2010/0291888 | A1 | 11/2010 | Hadjichristos et al. |
| 2011/0001877 | A1 | 1/2011 | Pugel |
| 2011/0069645 | A1 | 3/2011 | Jones |
| 2011/0241782 | A1* | 10/2011 | Clifton ......................... 330/295 |
| 2011/0241787 | A1 | 10/2011 | Mastovich |
| 2011/0250926 | A1 | 10/2011 | Wietfeldt et al. |
| 2012/0235735 | A1 | 9/2012 | Spits et al. |
| 2012/0281597 | A1 | 11/2012 | Khlat et al. |
| 2012/0320803 | A1 | 12/2012 | Skarp |
| 2013/0122824 | A1 | 5/2013 | Schell |
| 2013/0321095 | A1 | 12/2013 | Lam et al. |
| 2013/0336181 | A1 | 12/2013 | Khlat et al. |
| 2013/0337752 | A1 | 12/2013 | Khlat |
| 2013/0337754 | A1 | 12/2013 | Khlat |
| 2014/0015731 | A1 | 1/2014 | Khlat et al. |
| 2014/0024322 | A1 | 1/2014 | Khlat |
| 2014/0024329 | A1 | 1/2014 | Khlat |
| 2014/0051372 | A1 | 2/2014 | Shoshan et al. |
| 2014/0073371 | A1 | 3/2014 | Mujtaba et al. |
| 2014/0092795 | A1 | 4/2014 | Granger-Jones |
| 2014/0105079 | A1 | 4/2014 | Bengtsson et al. |
| 2014/0106693 | A1 | 4/2014 | Khlat |
| 2014/0227982 | A1 | 8/2014 | Granger-Jones et al. |
| 2015/0036563 | A1 | 2/2015 | Hurd et al. |

OTHER PUBLICATIONS

Notice of Allowance for U.S. Appl. No. 13/045,604, mailed May 17, 2013, 11 pages.
Non-Final Office Action for U.S. Appl. No. 13/045,621, mailed May 31, 2013, 13 pages.
Notice of Allowance for U.S. Appl. No. 13/045,621, mailed Sep. 24, 2013, 10 pages.
Final Office Action for U.S. Appl. No. 13/852,527, mailed Jan. 12, 2015, 21 pages.
Non-Final Office Action for U.S. Appl. No. 13/942,778, mailed Jan. 22, 2015, 5 pages.
Final Office Action for U.S. Appl. No. 13/852,309, mailed Feb. 18, 2015, 12 pages.
Notice of Allowance and Examiner-Initiated Interview Summary for U.S. Appl. No. 14/052,221, mailed Feb. 26, 2015, 9 pages.
Non-Final Office Action for U.S. Appl. No. 13/929,987, mailed Jan. 30, 2015, 11 pages.
Non-Final Office Action for U.S. Appl. No. 13/852,309, mailed Oct. 14, 2014, 10 pages.
Non-Final Office Action for U.S. Appl. No. 13/944,972, mailed Nov. 13, 2014, 10 pages.
U.S. Appl. No. 13/460,861, filed May 1, 2012, now U.S. Pat. No. 8,774,065.
U.S. Appl. No. 13/852,527, filed Mar. 28, 2013.
U.S. Appl. No. 13/939,941, filed Jul. 11, 2013.
U.S. Appl. No. 13/943,969, filed Jul. 17, 2013.
U.S. Appl. No. 13/942,778, filed Jul. 16, 2013.
U.S. Appl. No. 14/011,802, filed Aug. 28, 2013.
U.S. Appl. No. 13/852,309, filed Mar. 28, 2013.
U.S. Appl. No. 13/953,808, filed Jul. 30, 2013.
U.S. Appl. No. 14/052,221, filed Oct. 11, 2013.
U.S. Appl. No. 14/133,024, filed Dec. 18, 2013.
U.S. Appl. No. 13/929,987, filed Jun. 28, 2013.
U.S. Appl. No. 13/944,972, filed Jul. 18, 2013.
U.S. Appl. No. 13/950,432, filed Jul. 25, 2013.
U.S. Appl. No. 13/952,880, filed Jul. 29, 2013.
Author Unknown, "3rd Generation Partnership Project; Technical Specification Group Radio Access Network; Evolved Universal Terrestrial Radio Access (E-UTRA); User Equipment (UE) Radio Transmission and Reception (Release 11)," Technical Specification 36.101, Version 11.1.0, Jun. 2012, 3GPP Organizational Partners, 336 pages.
Author Unknown, "MIPI Alliance Application Note for Analog Control Interface—Envelope Tracking," ACI-ET, Version 1.0.0, Release 19, Oct. 4, 2012, 1 page.
Djoumessi, Erick Emmanuel, et al., "Electronically Tunable Diplexer for Frequency-Agile Transceiver Front-End," 2010 IEEE MTT-S International Microwave Symposium Digest (MTT), May 23-28, 2010, pp. 1472-1475.
Valkenburg, M.E., Van. "12.2 Pole Reciprocation." Analog Filter Design. New York: CBS College Publishing, 1982. pp. 327-333.
Wang, Zhao-Ming, et al., "The Design of a Symmetrical Diplexer Composed of Canonical Butterworth Two-Port Networks," 1988 IEEE International Symposium on Circuits and Systems, vol. 2, Jun. 7-9, 1988, pp. 1179-1182.
Williams, Arthur Bernard, et al. Electronic Filter Design Handbook, 3rd. ed. New York: McGraw-Hill, 1995. pp. 3.1-4.7 and 11.72-11.73.
Zverev, Anatol I. Handbook of Filter Synthesis, New York: John Wiley & Sons, 1967. pp. 192-193.
Non-Final Office Action for U.S. Appl. No. 13/852,527, mailed Sep. 30, 2014, 19 pages.
Notice of Allowance for U.S. Appl. No. 14/056,135, mailed Feb. 23, 2015, 10 pages.
Notice of Allowance for U.S. Appl. No. 13/944,972, mailed Apr. 13, 2015, 7 pages.
Non-Final Office Action for U.S. Appl. No. 13/852,527, mailed Apr. 23, 2015, 23 pages.

(56) References Cited

OTHER PUBLICATIONS

Notice of Allowance for U.S. Appl. No. 13/942,778, mailed May 14, 2015, 10 pages.
Advisory Action for U.S. Appl. No. 13/852,309, mailed Apr. 29, 2015, 4 pages.
Advisory Action for U.S. Appl. No. 13/852,309, mailed May 27, 2015, 4 pages.
Notice of Allowance for U.S. Appl. No. 13/852,527, mailed Aug. 14, 2015, 8 pages.
Notice of Allowance for U.S. Appl. No. 13/852,309, mailed Jul. 23, 2015, 7 pages.
Notice of Allowance for U.S. Appl. No. 13/929,987, mailed Jun. 23, 2015, 8 pages.
Corrected Notice of Allowance for U.S. Appl. No. 13/929,987, mailed Jul. 21, 2015, 5 pages.
Non-Final Office Action for U.S. Appl. No. 13/950,432, mailed Jul. 28, 2015, 14 pages.
Non-Final Office Action for U.S. Appl. No. 13/952,880, mailed Jul. 29, 2015, 17 pages.
Corrected Notice of Allowability for U.S. Appl. No. 13/852,309, mailed Oct. 9, 2015, 5 pages.
Corrected Notice of Allowability for U.S. Appl. No. 13/852,309, mailed Nov. 3, 2015, 5 pages.
Non-Final Office Action for U.S. Appl. No. 14/133,024, mailed Sep. 15, 2015, 28 pages.
Non-Final Office Action for U.S. Appl. No. 14/011,802, mailed Sep. 30, 2015, 65 pages.

* cited by examiner

FRONT END RADIO ARCHITECTURE (FERA) WITH POWER MANAGEMENT

RELATED APPLICATIONS

The present application claims priority to U.S. Provisional Patent Application No. 61/712,425, filed Oct. 11, 2012. The present application claims priority to and is a continuation-in-part of U.S. patent application Ser. No. 13/460,861, filed May 1, 2012, entitled RADIO FRONT END AND POWER MANAGEMENT ARCHITECTURE FOR LTE-ADVANCED, now U.S. Pat. No. 8,774,065, which claims priority to U.S. Provisional Patent Application No. 61/481,311, filed May 2, 2011.

All of the applications listed above are hereby incorporated herein by reference in their entireties.

FIELD OF THE DISCLOSURE

The present disclosure relates to front end radio architectures (FERAS) directed towards long term evolution advanced (LTE-Advanced) user equipment (UE) having operational modes for transmit (TX) multiple-input multiple-output (MIMO) and uplink (UL) carrier aggregation (CA).

BACKGROUND

A long term evolution advanced (LTE-Advanced) network standard has been developed to provide wireless data rates of 1 Gbps downlink and 500 Mbps uplink. The LTE-Advanced network standard also offers multi-carrier transmission and reception within a single band as well as multi-carrier transmission and reception within two separate bands. Multi-carrier transmission within a single band is referred to as intra-band transmission and reception. In contrast, multi-carrier transmission and reception within two different bands is referred to as inter-band transmission and reception. LTE-Advanced technology is also known as fourth generation (4G) technology.

LTE-Advanced operation requires a simultaneous dual carrier transmission in the same band (i.e., intra-band) and into different bands (i.e., inter-band). A transmission of dual LTE-Advanced carriers in a single band in a non-contiguous manner will result in an increased peak-to-average ratio (PAR) of around 1 dB. This increase is over an increase of about 1 dB of PAR due to a use of clustered single carrier frequency division multiple access (SC-FDMA). The combined increase in PAR results in a significant negative impact on efficiency of a transmitter chain made up of a transceiver and a power amplifier (PA).

In this regard, envelope following techniques for linear modulation are highly desirable for LTE-Advanced customers and others in the years to come because envelope following and pseudo-envelope following enable a very efficient use of energy. Envelope following techniques employ envelope following systems that are power management systems that control power amplifiers (PAs) in such a way that the PA collector/drain voltage (referred to herein as VCC) follows an RF input signal envelope. The RF input signal envelope is an instantaneous voltage of a PA input RF signal, (referred to herein as VIN).

Implementing pseudo-envelope following improves overall efficiency of PA systems because a power management function is realized using high efficiency switcher systems. However, using envelope following techniques is not practical for transmitter chains that involve dual intra-band carriers due to a large bandwidth requirement that would be placed on a typical switching power supply. The reason for the large bandwidth requirement is that bandwidth is a function of frequency separation between the dual intra-band carriers. For the purpose of this disclosure, envelope following systems include pseudo-envelope following systems, wherein pseudo-envelope following is envelope tracking that includes power amplifier (PA) collector/drain voltage pre-distortion to ameliorate power amplifier nonlinearity. It should be understood that envelope following is sometimes referred to as envelope tracking by some.

Lack of practical envelope following systems presents a major challenge for realizing front end radio architectures (FERAs) that are necessary for providing multi-carrier operation using intra-band and inter-band transmission and reception. FERAs that do not employ envelope following systems cannot operate efficiently due to the extra 2 dB of PAR.

FIG. 1 is a schematic of a related art front end radio architecture (FERA) 10 that is not configured to accept power from power management architectures that employ envelope following. The FERA 10 includes a transmitter block 12 for transmitting LTE Advanced multi-carrier signals. The FERA 10 also includes a first power amplifier (PA) 14 powered by a first switcher 16 and a second PA 18 powered by a second switcher 20.

A first duplexer 22 for an RF band A and a first receive (RX) diversity/multiple-input multiple-output (MIMO) filter 24 for an RF band B are coupled between the first PA 14 and a first band switch 26. The first duplexer 22 and the first RX diversity/MIMO filter 24 are selectively coupled to a first antenna 28 through the first band switch 26. The first duplexer 22 outputs signals RX_A captured by the first antenna 28. The first RX diversity/MIMO filter 24 outputs signals RX_B_DIV also captured by the first antenna 28. The first band switch 26 is controlled by a control signal CTRL1.

A second duplexer 30 for the RF band B and a second RX diversity/MIMO filter 32 are coupled between the second PA 18 and a second band switch 34. The second duplexer 30 is selectively coupled to a second antenna 36 through the second band switch 34. The second duplexer 30 outputs signals RX_B captured by the second antenna 36. The second RX diversity/MIMO filter 32 outputs signals RX_A_DIV also captured by the second antenna 36.

The transmitter block 12 includes a first transmitter 38, a first RF modulator 40, a first radio frequency (RF) phase locked loop (PLL) 42, a second transmitter 44, a second RF modulator 46, and a second RF PLL 48. The transmitter block 12 further includes a multi-carrier combiner 50 for combining signals output from the first RF modulator 40 and the second RF modulator 46.

The related art FERA 10 can operate in an intra-band multi-carrier mode. During operation of the related art FERA 10 in the intra-band multi-carrier mode, the first transmitter 38 outputs analog baseband (ABB) signals to the first RF modulator 40. Similarly, the second transmitter 44 outputs ABB signals to the second RF modulator 46. In response, the first RF modulator 40 in cooperation with the first RF PLL 42 outputs a first carrier within the RF band A while the second RF modulator 46 in cooperation with the second RF PLL 48 outputs a second carrier that is also within the band A. The first PA 14 provides power amplification of the first carrier and the second carrier which are output through the first duplexer 22 to the first antenna 28.

The related art FERA 10 also includes an inter-band multi-carrier mode. During operation of the related art FERA 10 using the inter-band multi-carrier mode, the first RF modulator 40 in cooperation with the first RF PLL 42 outputs a first carrier within the RF band A while the second RF modulator 46 in cooperation with the second RF PLL 48 outputs a second carrier within the RF band B. The first PA 14 provides power amplification of the first carrier which is output through the first duplexer 22 to the first antenna 28. The second PA 18 provides power amplification of the second carrier which is output through the second duplexer 30 to the second antenna 36.

While the related art FERA 10 offers a realizable architecture for LTE-Advanced operation, the related art FERA 10 is wasteful with regard to energy, in that the related art FERA 10 is not structured to take advantage of a high energy efficiency operation provided by envelope following systems. Energy efficiency in battery powered user equipment (UE) such as mobile terminals that implement LTE-Advanced operation is very important, since a relatively long operation time between battery charges is desirable.

FIG. 2 is a spectrum diagram that illustrates a common collector voltage (VCC) bandwidth (BW) switcher modulation requirement for intra-band dual carrier transmission. In particular, the modulation bandwidth of the first switcher 16 (FIG. 1) and the second switcher 20 (FIG. 1) is a function of an offset frequency Df between a carrier #1 and a carrier #2. Therefore, the higher the offset frequency Df between the carrier #1 and the carrier #2, the higher the modulation bandwidth must be. At some point, the offset frequency Df is large enough that related art approaches for modulating a VCC pseudo envelope following (PEF) signal via either the switcher 16 or the switcher 20 are no longer practical. For example, if the offset frequency is 40 MHz, then the supply modulation bandwidth needed for envelope tracking is about 1.5×(40 MHz+20 MHz) or about 90 MHz for LTE-Advanced carriers having around 20 MHz of bandwidth. A multiplier of 1.5 is a result of a square root operation of PEF calculation. Moreover, even if the offset frequency Df is equal to zero between two adjacent carriers having a 20 MHz bandwidth each, a resulting 50 MHz VCC BW is too large for efficient modulation of the VCC PEF via either the first switcher 16 or the second switcher 20. Thus, there is a need to practically meet the VCC BW switcher modulation bandwidth requirement in order to implement LTE-Advanced operation in a more efficient manner than is possible with the related art FERA 10. Moreover, there is a need for a FERA with power management architecture for multi-band power amplifiers that allows operation for TX MIMO (TX Diversity) along with uplink (UL) carrier aggregation (CA).

SUMMARY

Embodiments of a front end radio architecture (FERA) with power management are disclosed. The FERA includes a first power amplifier (PA) block having a first-first PA for amplifying first-first signals and a first-second PA for amplifying first-second signals. Also included is a second PA block having a second-first PA for amplifying second-first signals and a second-second PA for amplifying second-second signals. At least one power supply is adapted to selectively supply power to the first-first PA and the second-second PA through a first path. The power supply is also adapted to selectively supply power to the first-second PA and the second-first PA through a second path. A control system is adapted to selectively enable and disable the first-first PA, the first-second PA, the second-first PA, and the second-second PA in response to a selected mode of operation.

In at least one embodiment, a first mode of operation is realized by the control system being further adapted to enable the first-first PA, enable the first-second PA, disable the second-first PA, and disable the second-second PA. In an exemplary embodiment, the first PA block is a low band (LB) PA block, wherein the first mode of operation allows amplification of TX MIMO LB signals or uplink (UL) carrier aggregation (CA) LB intra-band non-contiguous signals or UL CA inter-band LB/LB signals. A second mode of operation is realized by the control system being adapted to disable the first-first PA, disable the first-second PA, enable the second-first PA, and enable the second-second PA. In this exemplary embodiment, the second PA block is a high band (HB) PA block, wherein the second mode of operation allows amplification of TX MIMO HB signals or UL CA HB intra-band non-contiguous signals or UL CA HB/HB signals. The control system is still further adapted to enable the first-first PA, disable the first-second PA, enable the second-first PA, and disable the second-second PA in a third mode of operation. In this exemplary embodiment the third mode operation allows amplification of UL CA LB/HB signals. A fourth mode of operation is realized by the control system being further adapted to enable the first-first PA, disable the first-second PA, disable the second-first PA, and disable the second-second PA. In this exemplary embodiment the fourth mode of operation allows amplification of UL CA intra-band contiguous or non-CA for LB signals that are input to the first-first PA. An advantage of the present disclosure is that it provides a PA and power management configuration for TX MIMO and UL CA operation using a relatively reduced amount of PA and power supply circuitry. It is to be understood that various types of radio frequency (RF) signals can be amplified with the first PA block and the second PA block, and the exemplary embodiment described is not limited to a particular signal protocol or particular segments of RF spectrum.

Another exemplary embodiment further includes a satellite PA block having a satellite PA and a satellite switch. In this exemplary embodiment, the satellite PA block is an ultrahigh band (UHB) PA block, wherein the satellite PA is a UHB PA and that the satellite switch is a UHB switch. In a fifth mode of operation, the control system enables the satellite PA block. In response, UHB signals arriving at a UHB IN input are amplified by the UHB PA before being selectively switched through the UHB switch to one of M outputs. It is to be understood that various types of RF signals can be amplified with the satellite PA block, and that the exemplary embodiment described is not limited to a particular signal protocol or particular segments of RF spectrum.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Embodiments of the present disclosure provide front end radio architecture (FERA) and power management architecture for LTE-Advanced operation. In particular, the FERA and power management of the present disclosure is configured to employ envelope following that is compatible with existing bandwidth limited to 20 MHz LTE-Advanced for dual carriers implemented in both intra-band and inter-band scenarios.

Figure 1:
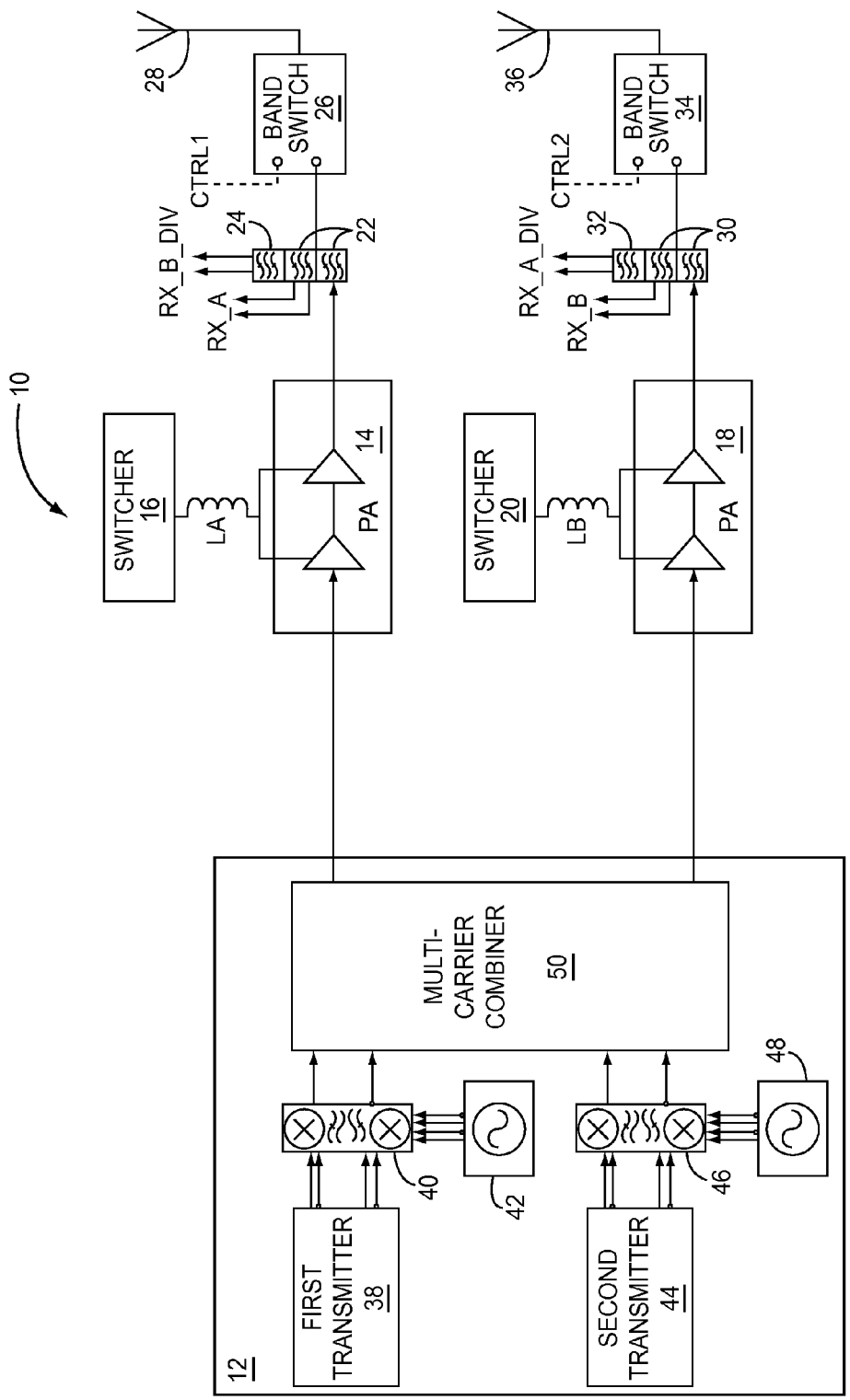
FIG. 1 is a schematic of a related art front end radio architecture (FERA) that is not configured to accept power from power management architectures that employ envelope following.
Figure 2:
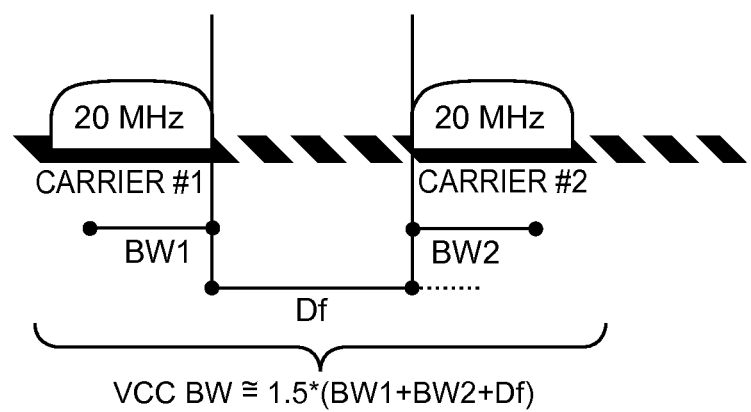
FIG. 2 is a spectrum diagram that illustrates a common collector voltage (VCC) bandwidth (BW) switcher modulation requirement for intra-band dual carrier transmission.
Figure 3:
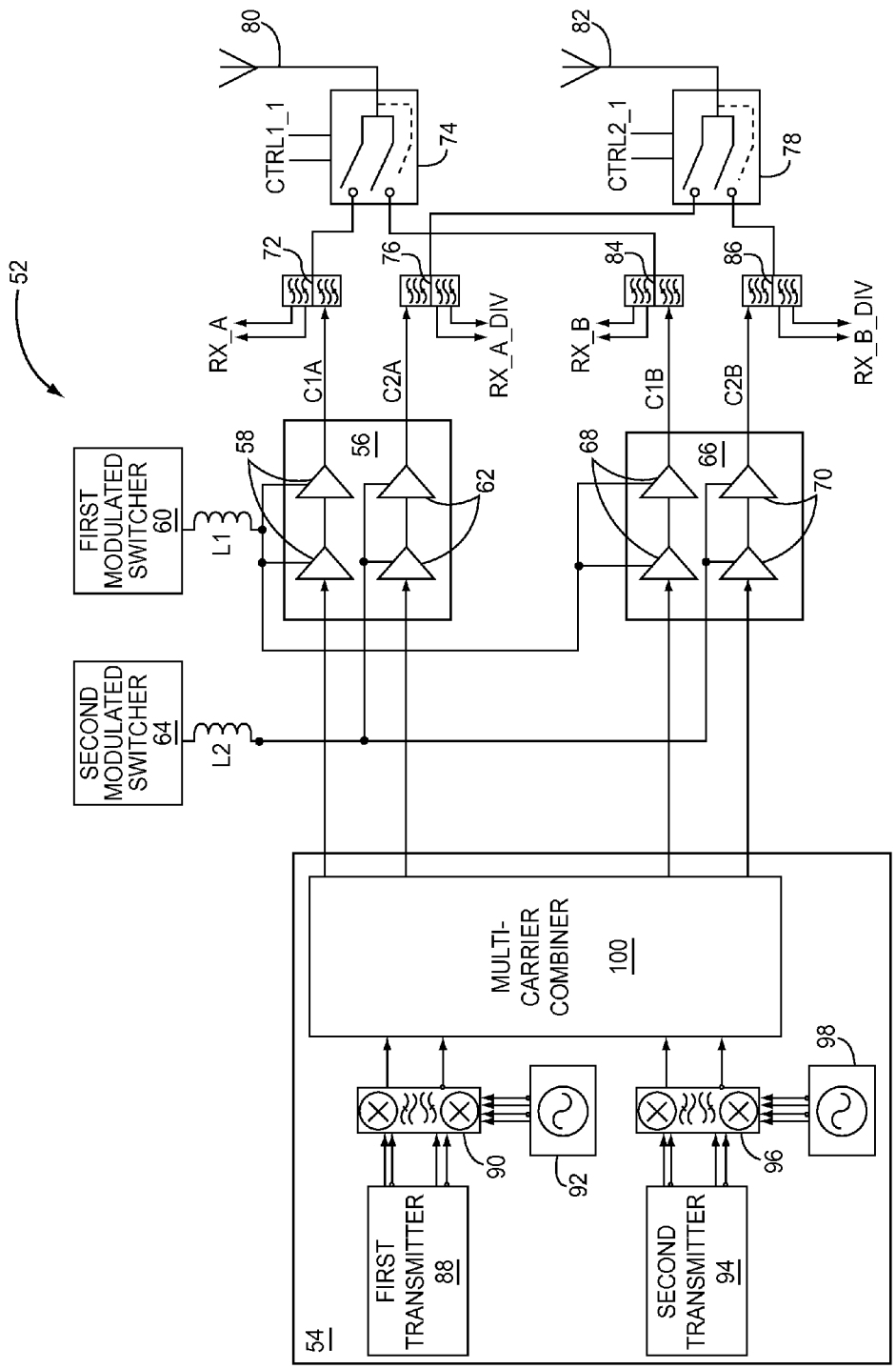
FIG. 3 is a schematic of a FERA that in accordance with the present disclosure is configured for operation with envelope following techniques.

FIG. 3 is a schematic of a FERA 52 that in accordance with the present disclosure is configured for operation with envelope following techniques. The FERA 52 includes a transmitter block 54 for transmitting LTE Advanced multi-carrier signals. The FERA 52 also includes a first PA block 56 having a first-first PA 58 that is selectively powered by a first modulated switcher 60 and a first-second PA 62 that is selectively powered by a second modulated switcher 64. The FERA 52 further includes a second PA block 66 having a second-first PA 68 that is selectively powered by the first modulated switcher 60 and a second-second PA 70 that is selectively powered by the second modulated switcher 64. The first modulated switcher 60 has a first output filter comprising a first inductor L1, while the second modulated switcher 64 includes a second output filter comprising a second inductor L2.

A first duplexer 72 for a first band A carrier C1A and a band A receive signal RX_A is coupled between an output of the first-first PA 58 and a first terminal of a first single pole double throw (SP2T) switch 74. A second duplexer 76 for a second band A carrier C2A and a band A diversity/MIMO receive signal RX_A_DIV is coupled between an output of the first-second PA 62 and a first terminal of a second SP2T switch 78. The first duplexer 72 is selectively coupled to a first antenna 80 through the first SP2T switch 74. The first duplexer 72 outputs the band A receive signal RX_A captured by the first antenna 80. The second duplexer 76 is selectively coupled to a second antenna 82 through the second SP2T switch 78. The second duplexer 76 outputs the band A diversity/MIMO receive signal RX_A_DIV captured by the second antenna 82. The first SP2T switch 74 is controllable by a first control signal CTRL1_1, whereas the second SP2T switch 78 is controllable by a second control signal CTRL2_1.

A third duplexer 84 for a first band B carrier C1B and a band B receive signal RX_B is coupled between an output of the second-first PA 68 and a second terminal of the first SP2T switch 74. A fourth duplexer 86 for a second band B carrier C2B and a band B diversity/MIMO receive signal RX_B_DIV is coupled between an output of the second-second PA 70 and a second terminal of the second SP2T switch 78. The third duplexer 84 is selectively coupled to the first antenna 80 through the first SP2T switch 74. The third duplexer 84 outputs the band B receive signal RX_B captured by the first antenna 80. The fourth duplexer 86 is selectively coupled to the second antenna 82 through the second SP2T switch 78. The fourth duplexer 86 outputs the band B diversity/MIMO receive signal RX_B_DIV captured by the second antenna 82.

The transmitter block 54 includes a first transmitter 88, a first RF modulator 90, a first radio frequency (RF) phase locked loop (PLL) 92, a second transmitter 94, a second RF modulator 96, and a second RF PLL 98. The transmitter block 54 further includes a multi-carrier combiner 100 for combining signals output from the first RF modulator 90 and the second RF modulator 96.

The FERA 52 can operate in an intra-band multi-carrier mode. During operation of the FERA 52 in the intra-band multi-carrier mode, the first transmitter 88 outputs analog baseband (ABB) signals to the first RF modulator 90. Similarly, the second transmitter 94 outputs ABB signals to the second RF modulator 96. In response, the first RF modulator 90 in cooperation with the first RF PLL 92 outputs the first carrier C1A within RF band A while the second RF modulator 96 in cooperation with the second RF PLL 98 outputs the second carrier C2A that is also within the RF band A. The first-first PA 58 provides power amplification of the first carrier C1A which is output through the first duplexer 72 to the first antenna 80. The first-second PA 62 provides power amplification of the second carrier C2A which is output through the second duplexer 76 to the second antenna 82.

The FERA 52 also includes an inter-band multi-carrier mode. During operation of the FERA 52 using the inter-band multi-carrier mode, the first RF modulator 90 in cooperation with the first RF PLL 92 outputs a first carrier C1A within the RF band A while the second RF modulator 96 in cooperation with the second RF PLL 98 outputs a second carrier C2B within the RF band B. The first PA block 56 provides power amplification of the first carrier, which is output through the first duplexer 72 to the first antenna 80. The second PA block 66 provides power amplification of the second carrier, which is output through the fourth duplexer 86 to the second antenna 82.

Figure 4:
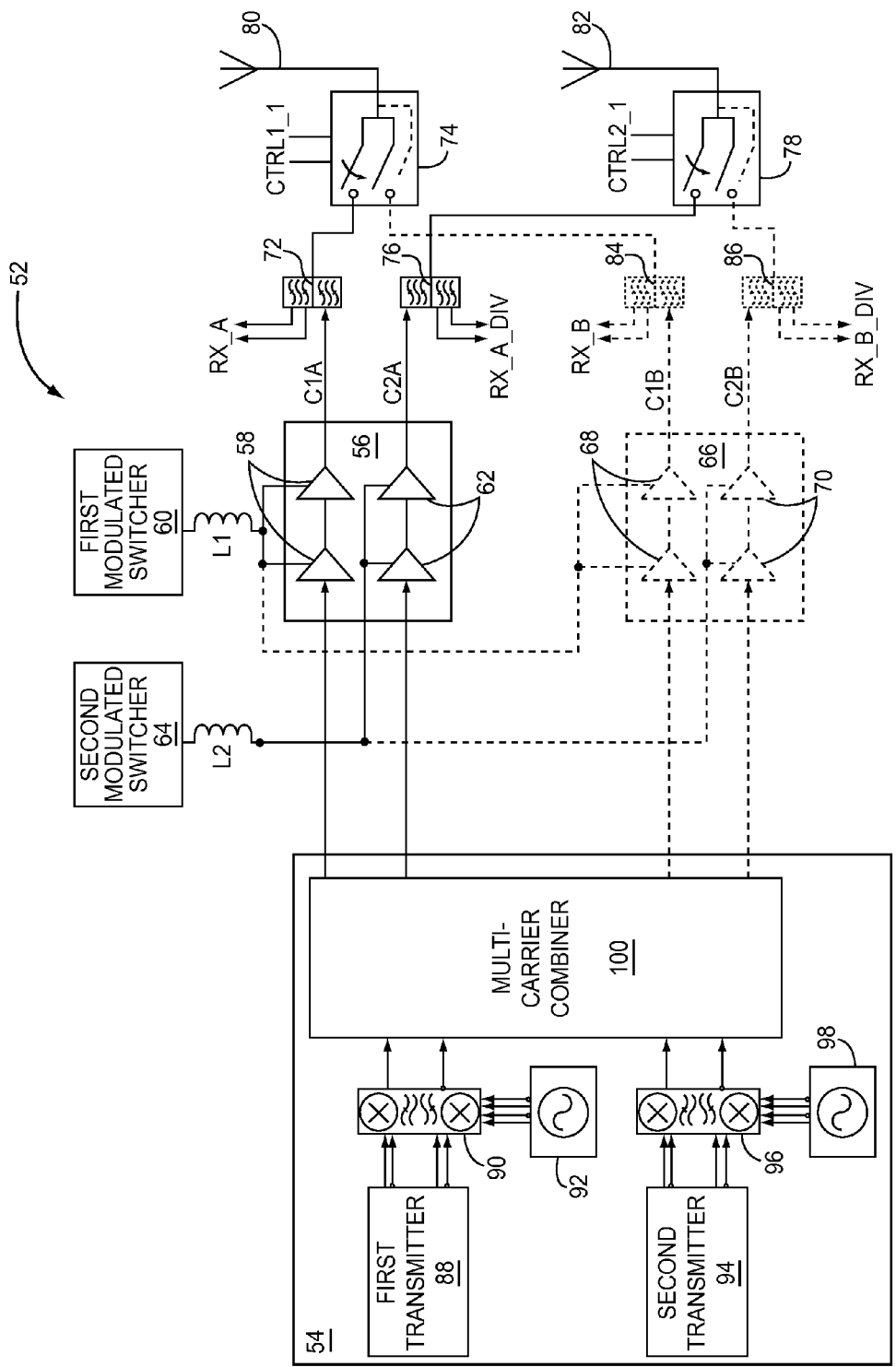
FIG. 4 is a schematic of the FERA during intra-band operation for band A.

FIG. 4 is a schematic of the FERA 52 during intra-band operation for band A. Dashed lines in FIG. 4 represent deactivated or unused components. In the case of intra-band carrier aggregation into band A, the second PA block 66 is deactivated, while the third duplexer 84 and the fourth duplexer 86 are unused. However, the first PA block 56 remains completely energized with the first-first PA 58 being supplied with power from the first modulated switcher 60 and the first-second PA 62 being supplied with power from the second modulated switcher 64. The CTRL1_1 signal closes the first throw of the first SP2T switch 74 so that the first carrier C1A is transmitted from the first antenna 80, while the band A receive signal RX_A is captured by the first antenna 80 and output from the first duplexer 72. Similarly, the CTRL2_1 signal closes a first throw of the second SP2T switch 78 so that the second carrier C2A is transmitted from the second antenna 82, and so that the band A diversity/MIMO receive signal RX_A_DIV captured by the second antenna 82 is output from the second duplexer 76.

Figure 5:
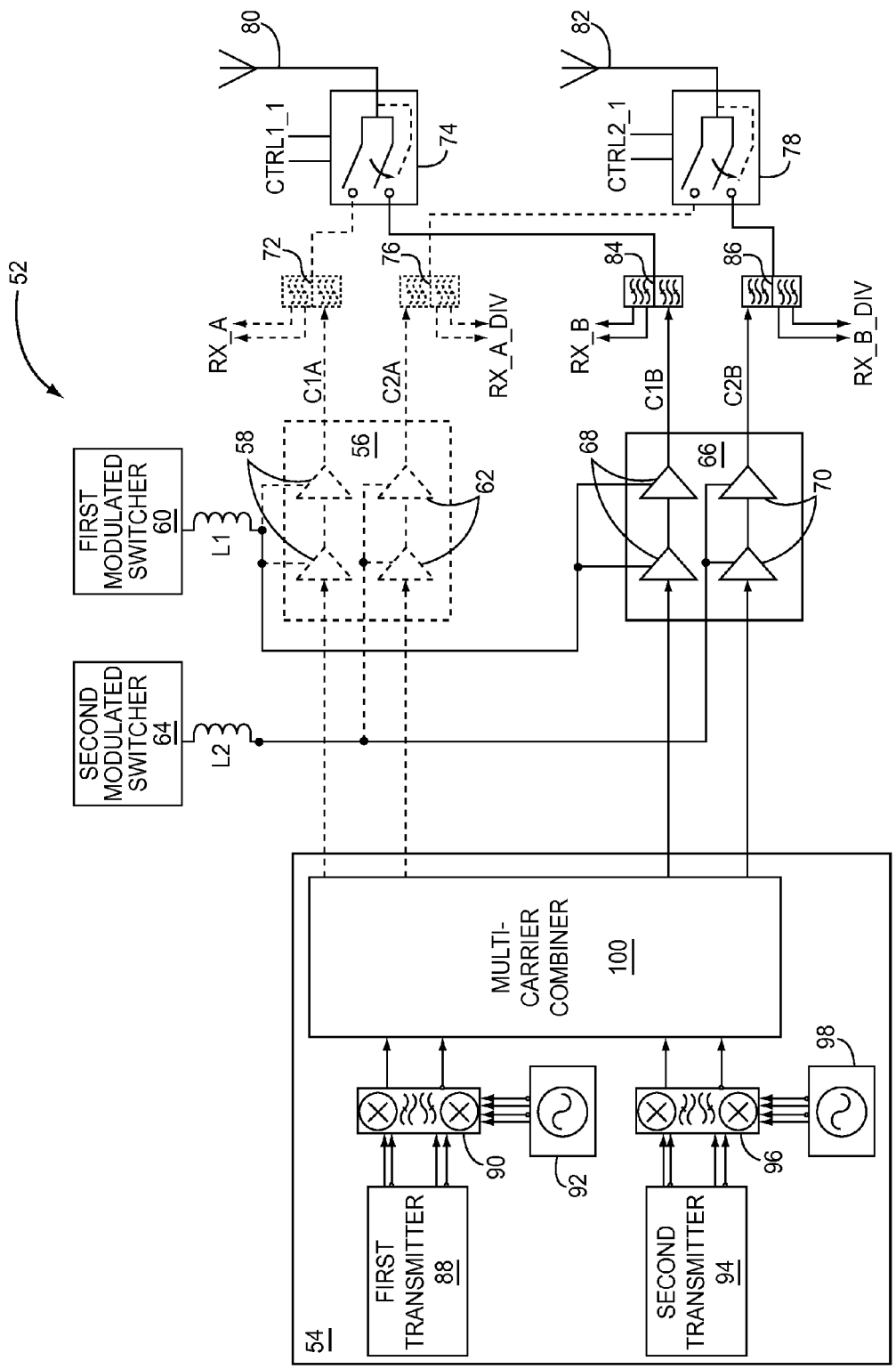
FIG. 5 is a schematic of the FERA during intra-band operation for band B.

FIG. 5 is a schematic of the FERA 52 during intra-band operation for band B. Dashed lines in FIG. 5 represent deactivated or unused components. In the case of intra-band carrier aggregation into band B, the first PA block 56 is deactivated, while the first duplexer 72 and the second duplexer 76 are unused. However, the second PA block 66 remains completely energized with the second-first PA 68 being supplied with power from the first modulated switcher 60, and the second-second PA 70 being supplied with power from the second modulated switcher 64. The CTRL1_1 signal closes a second throw of the first SP2T switch 74 so that the first carrier C1B is transmitted from the first antenna 80, and so that the band B receive signal RX_B captured by the first antenna 80 is output from the third duplexer 84. Similarly, the CTRL2_1 signal closes a second throw of the second SP2T switch 78 so that the second carrier C2B is transmitted from the second antenna 82, and so that the band B diversity/MIMO receive signal RX_B_DIV captured by the second antenna 82 is output from the fourth duplexer 86.

Figure 6:
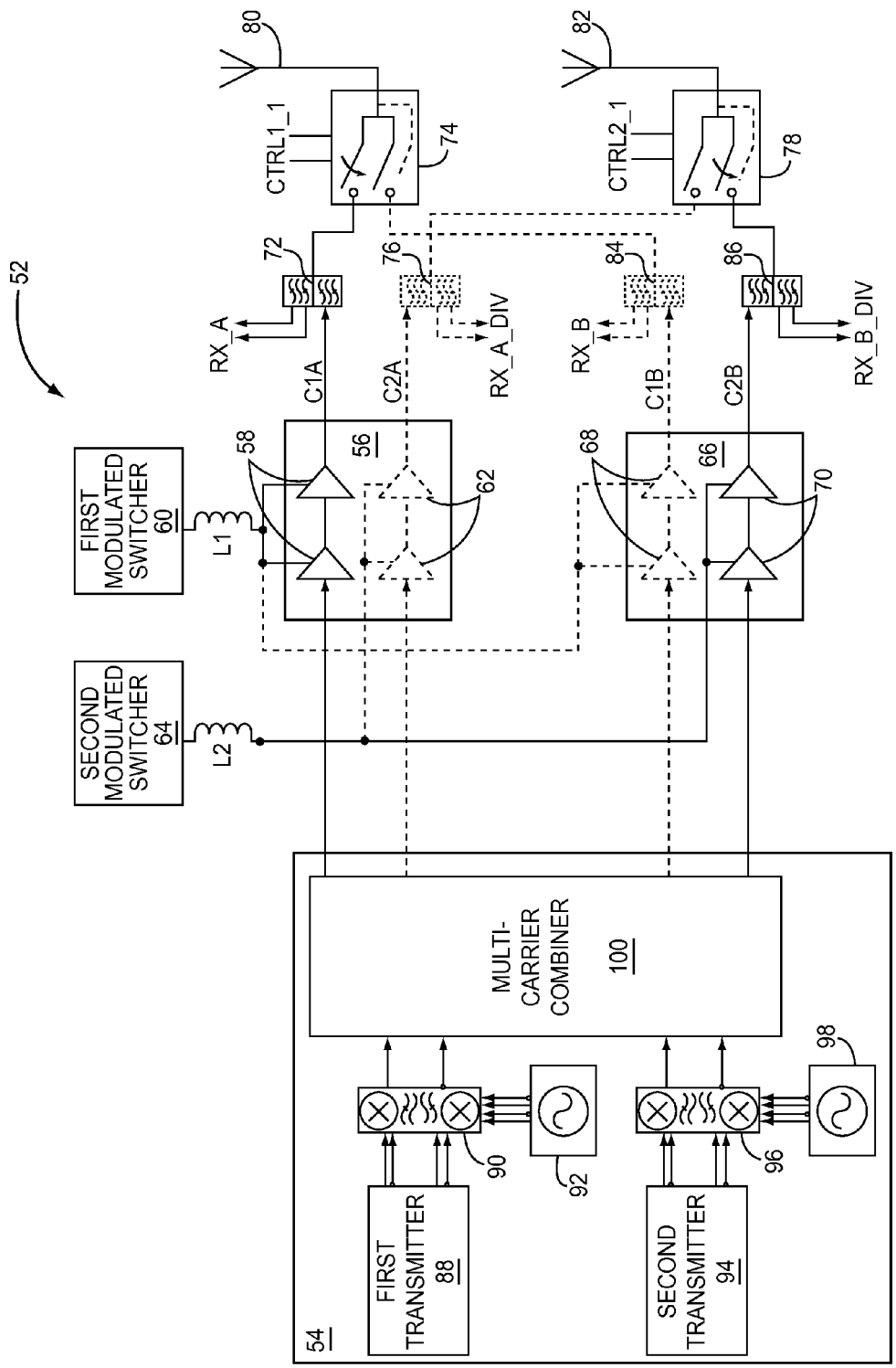
FIG. 6 is a schematic of the FERA during inter-band operation between band A and band B.

FIG. 6 is a schematic of the FERA 52 during inter-band operation between band A and band B. Dashed lines represent deactivated or unused components. In the case of inter-band carrier aggregation between band A and band B, the first PA block 56 and the second PA block 66 are only partially energized. In particular, the first-first PA 58 is powered by the first modulated switcher 60 and the second-second PA 70 is powered by the second modulated switcher 64, while the second-first PA 68 and the first-second PA 62 are deactivated. The second duplexer 76 and the third duplexer 84 are unused. The control signal CTRL1_1 closes the first throw of the first SP2T switch 74 so that the first carrier C1A is transmitted from the first antenna 80, and so that the band A receive signal RX_A is output from the first duplexer 72. Similarly, the control signal CTRL2_1 closes the second throw of the second SP2T switch 78 so that the second carrier C2B is transmitted from the second antenna 82, and so that the band B diversity/MIMO receive signal RX_B_DIV is output from the fourth duplexer 86.

Figure 7:
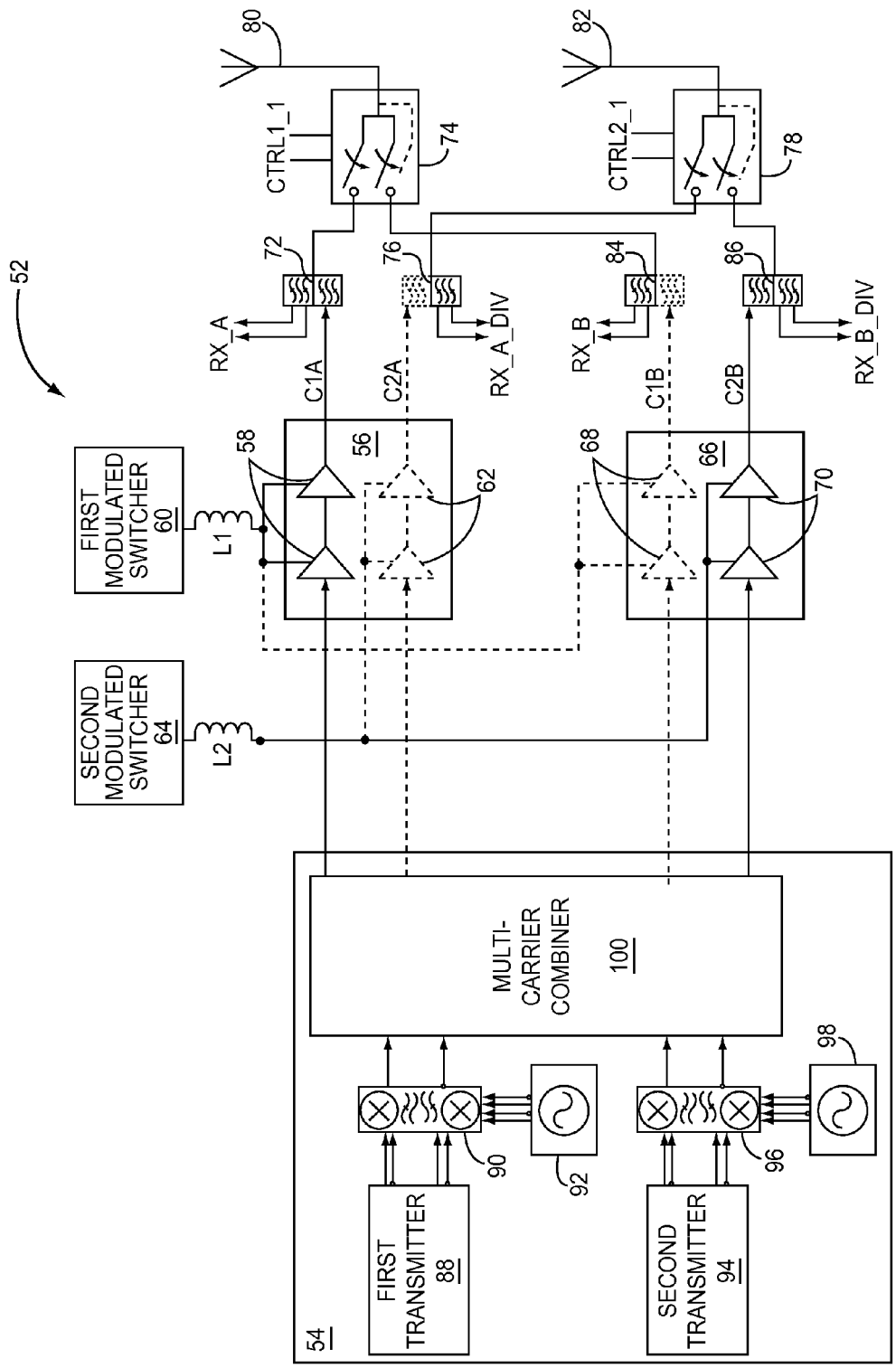
FIG. 7 is a schematic of the FERA during inter-band operation between band A and band B with receive diversity using multiple-input multiple-output (MIMO).

FIG. 7 is a schematic of the FERA 52 during inter-band operation between band A and band B with receive diversity using MIMO. Dashed lines represent deactivated or unused components. In the case of inter-band carrier aggregation between band A and band B with receive diversity using MIMO, the first PA block 56 and the second PA block 66 are only partially energized as in FIG. 6. However, in order to realize diversity using MIMO for both band A and band B, the first and second throws of the first SP2T switch 74 and the second SP2T switch 78 are closed by the control signals CTRL1_1 and CTRL2_1. In this manner, the first carrier C1A is transmitted from the first antenna 80, while the band A receive signal RX_A captured by the first antenna 80 is output from the first duplexer 72, and the band A diversity/MIMO receive signal RX_A_DIV captured by the second antenna 82 is output from the second duplexer 76. Similarly, the second carrier C2B is transmitted from the second antenna 82, while the band B receive signal RX_B captured by the first antenna 80 is output from the third duplexer 84, and the band B diversity/MIMO receive signal RX_B_DIV captured by the second antenna 82 is output from the fourth duplexer 86.

Figure 8:
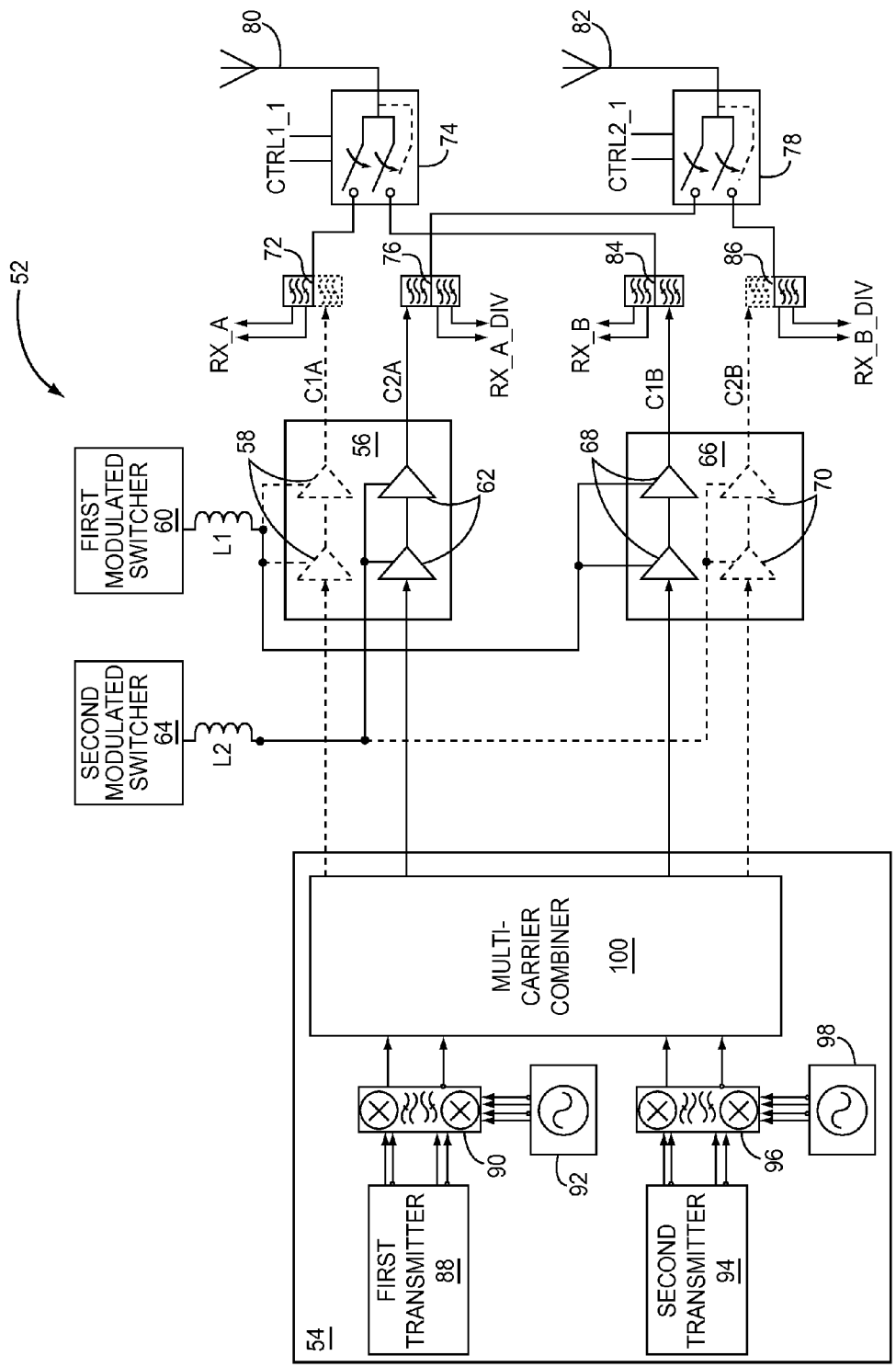
FIG. 8 is a schematic of the FERA during inter-band operation between band A and band B with receive diversity/MIMO and swapped carrier transmission.

FIG. 8 is a schematic of the FERA 52 during inter-band operation between band A and band B with receive diversity using MIMO and swapped carrier transmission. Dashed lines represent deactivated or unused components. In the case of inter-band carrier aggregation between band A and band B with receive diversity using MIMO and swapped carrier transmission, the first PA block 56 and the second PA block 66 are only partially energized. However, in contrast to the operation depicted in FIG. 7, the first-first PA 58 and the second-second PA 70 are deactivated, while the second-first PA 68 is energized by the first modulated switcher 60 and the first-second PA 62 is energized by the second modulated switcher 64. Yet, the first and second throws of the first SP2T switch 74 and the second SP2T switch 78 remain closed by the control signals CTRL1_1 and CTRL2_1. In this way, the band A receive signal RX_A captured by the first antenna 80 is output from the first duplexer 72, and the band B receive signal RX_B, also captured by the first antenna 80, is output from the third duplexer 84. Moreover, the band A diversity/MIMO receive signal RX_A_DIV captured by the second antenna 82 is output from the second duplexer 76, while the band B diversity/MIMO receive signal RX_B_DIV is output from the fourth duplexer 86. Further still, the carrier C2A is transmitted from the second antenna 82, while the carrier C1B is transmitted from the first antenna 80.

The FERA 52 allows envelope tracking for dual carriers in both intra-band and inter-band operation. As a result, the FERA 52 offers improved efficiency for dual carrier operation. Moreover, intermodulation distortion is reduced due to separated transmitter chains comprised of the first PA block 56 and the second PA block 66. Further still, the configuration of the first SP2T switch 74 and the second SP2T switch 78 combined with the first duplexer 72, the second duplexer 76, the third duplexer 84, and the fourth duplexer 86 allows for carrier transmission diversity. However, these advantages offered by the FERA 52 come with an increased bill of materials (BOM) cost of an extra TX filter per band. Also, unless the extra complexity of a half-power split type amplifier is implemented an additional cost of an extra PA block is included in the FERA 52.

Figure 9:
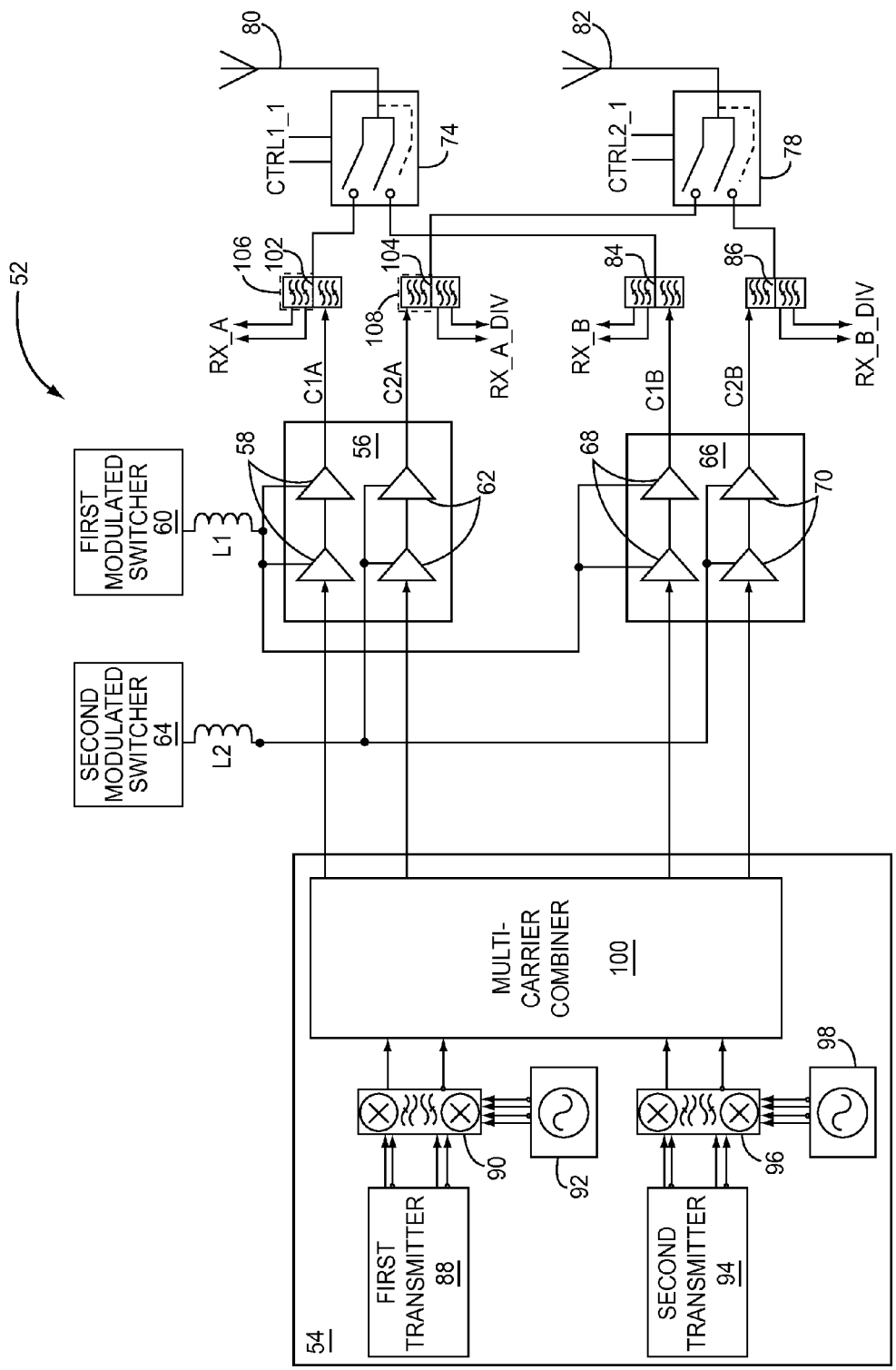
FIG. 9 is a schematic of the FERA that is modified to reduce bill of materials (BOM) costs by including split band duplexers for band A.

FIG. 9 is a schematic of the FERA 52 that is modified to reduce BOM costs by replacing the first duplexer 72 with a first split band duplexer 102, and by replacing the second duplexer 76 with a second split band duplexer 104. The first split band duplexer 102 includes a first TX filter 106 for passing the carrier C1A located in the lower half TX band of band A. Similarly, the second split band duplexer 104 includes a second TX filter 108 for passing the carrier C2A located in the upper half TX band of band A. The combined bandwidth of the first TX filter 106 and the second TX filter 108 is adaptable to cover the upper and lower halves of a given TX band.

Figure 10:
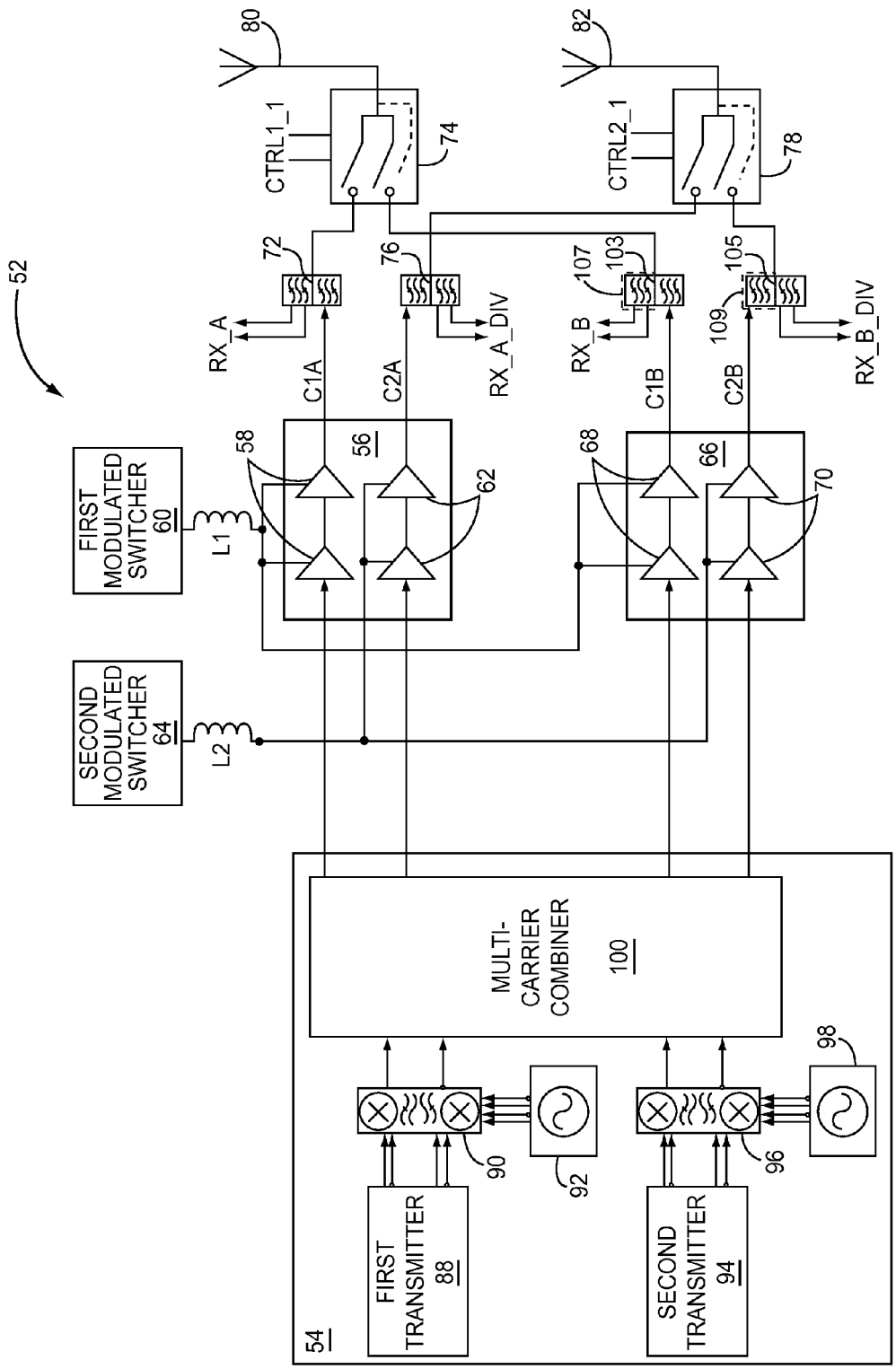
FIG. 10 is a schematic of the FERA that is modified to reduce BOM costs by including split band duplexers for band B.

FIG. 10 is a schematic of the FERA 52 that is also modified to reduce BOM costs by replacing the third duplexer 84 with a third split band duplexer 103, and by replacing the fourth duplexer 86 with a fourth split band duplexer 105. A third TX filter 107 passes the carrier C1B located in the lower half TX band of band B. Similarly, a fourth TX filter 109 passes the carrier C2B located in the upper half TX band of band B.

One modification (not shown) to the FERA 52 would allow a transmission of both halves of band A from the first antenna 80 and both halves of band B from the second antenna 82 by tuning the first PA block 56 for the carriers C1A and C1B, and the second PA block 66 for the carriers C2A and C2B. In this case, the first modulated switcher 60 would supply the second-second PA 70 and the second modulated switcher 64 would supply the second-first PA 68. In this way, the first antenna 80 would only be associated with band A and the second antenna 82 would only be associated with band B. However, IMD could be an issue with this implementation since the two half band carriers may not have enough antenna isolation between them. In contrast, the RX_A_DIV output and the RX_B_DIV output could remain as is shown in FIG. 3. The resulting receiver and transmitter separation would be relatively large. Thus, reducing the design requirements for filtering.

Figure 11:
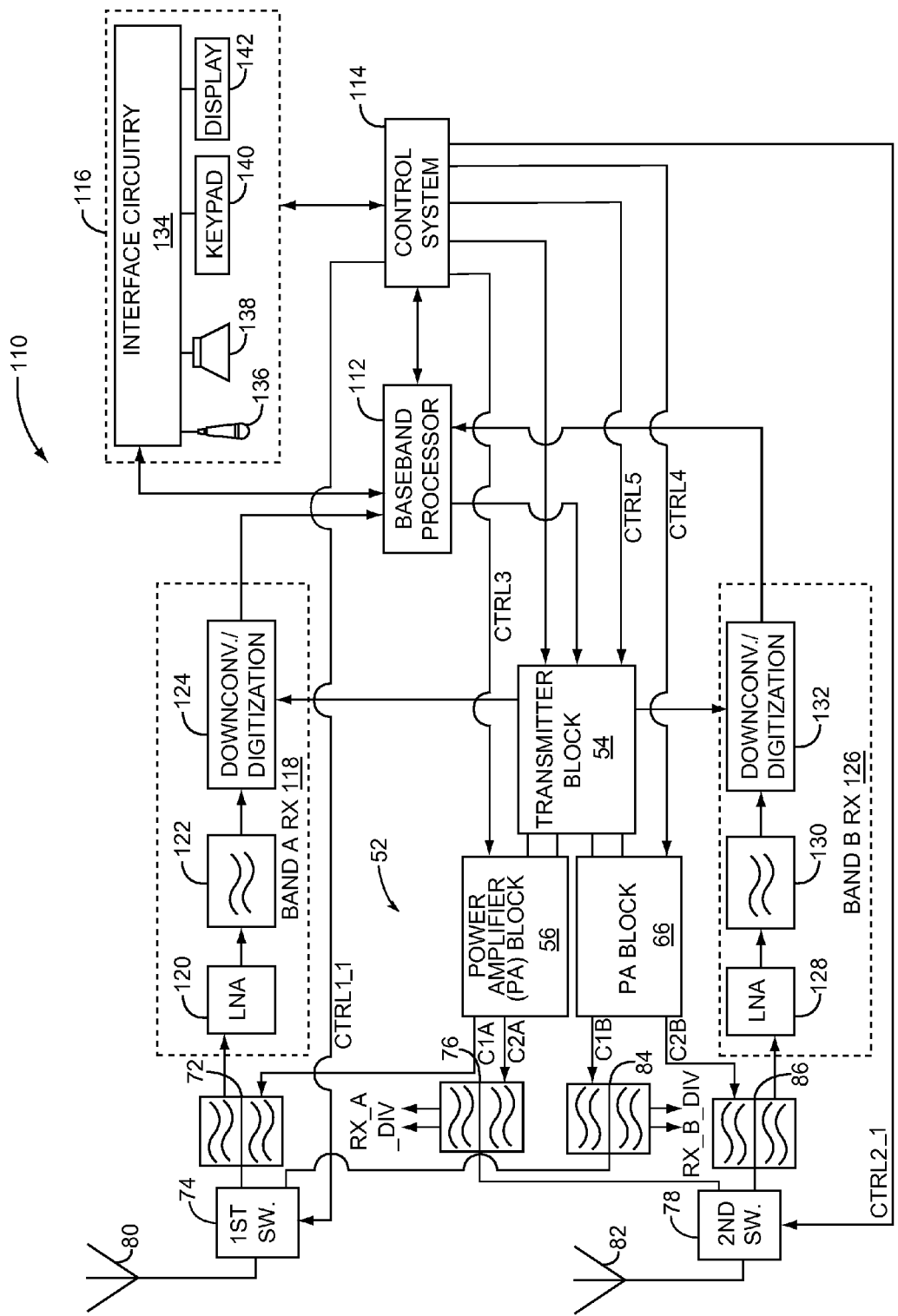
FIG. 11 depicts a mobile terminal that incorporates the FERA of the present disclosure.

FIG. 11 depicts user equipment (UE) in the form of a mobile terminal 110 that incorporates a preferred embodiment of the FERA 52 of the present disclosure. The mobile terminal 110 may be, but is not limited to, a mobile telephone, a personal digital assistant (PDA), or the like. The basic architecture of the mobile terminal 110 may also include a baseband processor 112, a control system 114, and an interface 116. The first antenna 80 receives information-bearing RF signals from one or more remote transmitters provided by a base station (not shown). The first SP2T switch 74 under the control of the CTRL1_1 signal output from the control system 114 allows the information-bearing RF signals to feed through the first duplexer 72 and into a band A RX 118. The band A RX 118 includes a low noise amplifier (LNA) 120 that amplifies the signal, and a first filter circuit 122 that minimizes broadband interference in the received signals. The band A RX 118 also includes downconversion and digitization circuitry 124, which downconverts the filtered, received signals to intermediate or baseband frequency signals, which are then digitized into one or more digital streams.

Similarly, the second antenna 82 receives information-bearing RF signals from one or more remote transmitters provided by a base station (not shown). The second SP2T switch 78 under the control of the CTRL2_1 signal output from the control system 114 allows the information-bearing signals to feed through the fourth duplexer 86 and into a band B RX 126. The band B RX 126 includes a second LNA 128 that amplifies the signals, and a second filter circuit 130 that minimizes broadband interference in the received signals. The band B RX 126 also includes downconversion and digitization circuitry 132, which downconverts the filtered, received signals to intermediate or baseband frequency signals, which are then digitized into one or more digital streams.

The baseband processor 112 processes the digitized received signals to extract the information or data bits conveyed in the received signals. This processing typically comprises demodulation, decoding, and error correction operations. As such, the baseband processor 112 is generally implemented in one or more digital signal processors (DSPs).

On the transmit side, the baseband processor 112 receives digitized data, which may represent voice, data, or control information, which it encodes for transmission, from the control system 114. The encoded data is output to the transmitter block 54. The PA blocks 56 and 66 amplify the carriers C1A C2A, C1B, and C2B to levels appropriate for transmission from the first antenna 80 and the second antenna 82. Different combinations of the carriers C1A, C2A, C1B, and C2B may also be transmitted from the first antenna 80 and the second antenna 82 under control of the control signals CTRL1_1 and CTRL2_1, as described previously.

A user may interact with the mobile terminal 110 via the interface 116, which may include interface circuitry 134 associated with a microphone 136, a speaker 138, a keypad 140, and a display 142. The interface circuitry 134 typically includes analog-to-digital converters, digital-to-analog converters, amplifiers, and the like. Additionally, it may include a voice encoder/decoder, in which case it may communicate directly with the baseband processor 112.

The microphone 136 will typically convert audio input, such as the user's voice, into an electrical signal, which is then digitized and passed directly or indirectly to the baseband processor 112. Audio information encoded in the received signal is recovered by the baseband processor 112 and converted by the interface circuitry 134 into an analog signal suitable for driving the speaker 138. The keypad 140 and the display 142 enable the user to interact with the mobile terminal 110, inputting numbers to be dialed, address book information, or the like, as well as monitoring call progress information.

Figure 12:
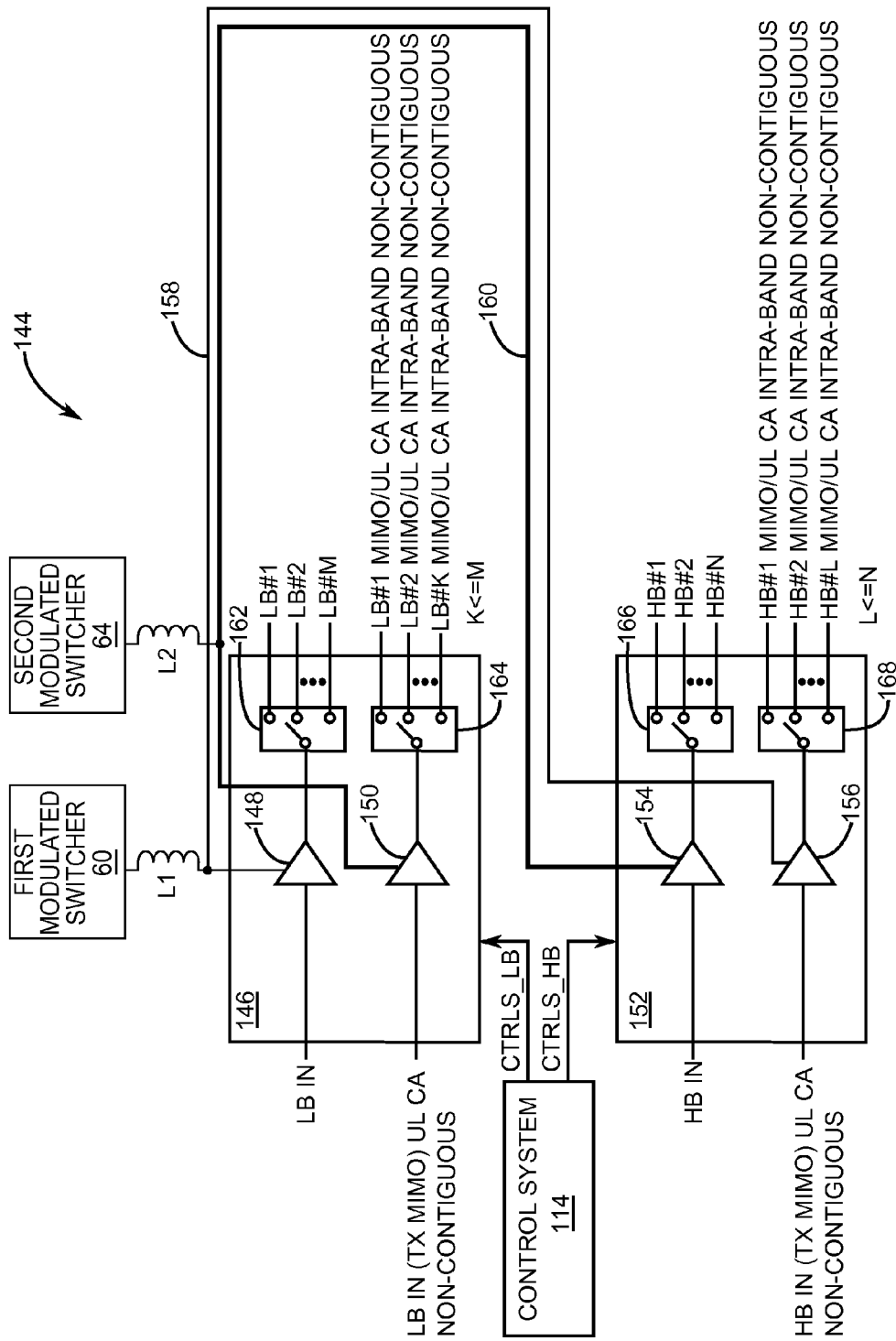
FIG. 12 is a schematic of an exemplary FERA power amplifier (PA) section having a power management configuration for transmit (TX) MIMO and uplink (UL) carrier aggregation (CA).

FIG. 12 is a schematic of an exemplary embodiment of a FERA PA section 144 having a power management configuration for transmit (TX) multiple-input multiple-output (MIMO) and uplink (UL) carrier aggregation (CA). The FERA PA section 144 includes a first PA block 146 that in this case is a low band (LB) power amplifier (PA) block having a first-first PA 148, which in this example is a first LB PA for amplifying LB signals and a first-second PA 150 that in this example is a second LB PA for amplifying TX MIMO LB signals. The FERA PA section 144 also includes a second PA block 152 that in this case is a high band (HB) PA block having a second-first PA 154, which in this example is an HB PA for amplifying HB signals and a second-second PA 156 that in this case is an HB PA for amplifying TX MIMO HB signals. The first PA block 146 typically includes circuitry adapted to bias the first-first PA 148 and the first-second PA 150. Likewise, the second PA block 152 typically includes circuitry adapted to bias the second-first PA 154 and the second-second PA 156. In a more generic example, the first-first PA 148 and the first-second PA 150 amplify first-first signals and first-second signals, respectively. Similarly, the second-first PA 154 amplifies second-first signals and the second-second PA 156 amplifies second-second signals. An example of spectrum use for the first-first signals and the first-second signals ranges from 690 MHz to 960 MHz, which is a band that can be considered to be a low band. An example of spectrum use for the second-first signals and the second-second signals ranges from 1710 MHz to 2220 MHz, which can be considered a medium band.

In the exemplary embodiment of FIG. 12, a first power supply is the first modulated switcher 60 that is adapted to selectively supply power to the first-first PA 148, and the second-second PA 156 through a first path 158. A second power supply is made up of the second modulated switcher 64 that is adapted to selectively supply power to the first-second PA 150 and the second-first PA 154 through a second path 160. Similar to the embodiment of FIG. 3, the first inductor L1 makes up a first output filter for the first modulated switcher 60, while the second inductor L2 makes up a second output filter for the second modulated switcher 64. However, it is to be understood that a single power supply with two independently filtered power supply outputs having different voltage levels is an alternative to the first modulated switcher 60 and the second modulated switcher 64. Moreover, it is to be understood that envelope tracking (ET), pseudo tracking (PT), and average power tracking (APT) power supply types are usable as power supplies for the embodiment depicted in FIG. 12.

The control system 114, which was first depicted in FIG. 11 is in this embodiment further adapted to generate first control signals CTRLS_LB to selectively enable and disable the first-first PA 148 and the first-second PA 150 in response to a selected mode of operation. The control system 114 is also further adapted to generate second control signals CTRLS_HB to selectively enable and disable the second-first PA 154, and the second-second PA 156 in response to a selected mode of operation. A first-first switch 162 and a first-second switch 164 that are depicted integral with the first PA block 146 are also controlled by the first control signals CTRLS_LB. First-first signals arriving at an LB IN input are amplified by the first-first PA 148 before being selectively switched through the first-first switch 162 to one of M outputs. Similarly, amplified versions of first-second signals such as TX MIMO signals are selectively switched through the first-second switch 164 to one of K outputs, wherein K≤M. Moreover, a second-first switch 166 and a second-second switch 168 that are depicted integral with the second PA block 152 are also controlled by the second control signals CTRLS_HB. Second-first signals arriving at an HB IN input are amplified by the second-first PA 154 before being selectively switched through the second-first switch 166 to one of N outputs. Similarly, amplified versions of second-second signals such as TX MIMO signals are selectively switched through the second-second switch 168 to one of L outputs, wherein L≤N.

Figure 13:
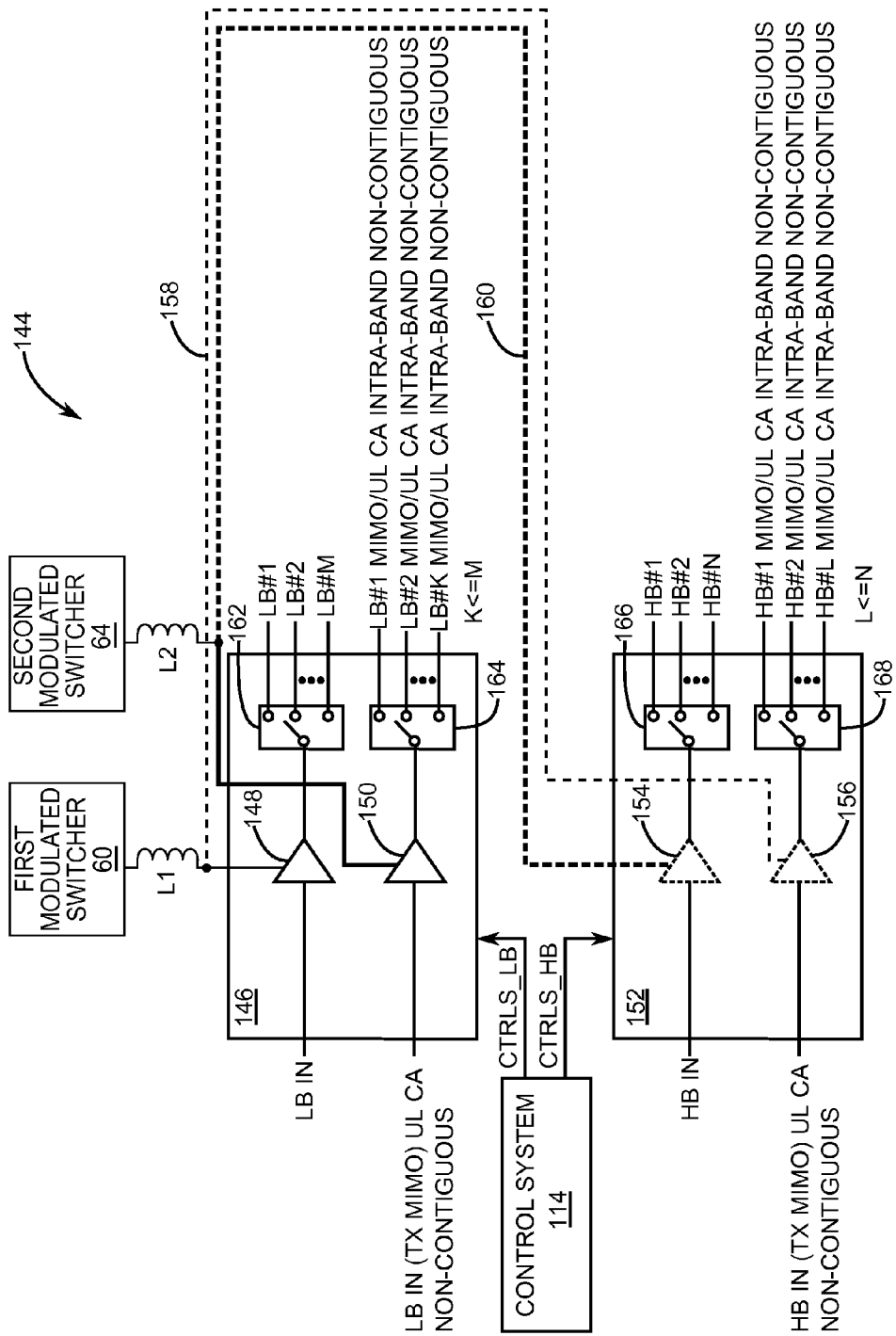
FIG. 13 is a schematic depicting operation of the exemplary FERA PA section in a first mode of operation for amplification of TX MIMO low band (LB) signals or UL CA LB intra-band non-contiguous or UL CA inter-band LB/LB signals.

FIG. 13 is a schematic that depicts operation of the FERA PA section 144 in a first mode of operation that allows amplification of TX MIMO LB signals or uplink (UL) carrier aggregation (CA) LB intra-band non-contiguous or UL CA inter-band LB/LB signals. In the first mode of operation, the control system 114 enables the first-first PA 148 to draw power from the first modulated switcher 60 via the first path 158, enables the first-second PA 150 to draw separate power from the second modulated switcher 64 via the second path 160, disables the second-first PA 154, and disables the second-second PA 156.

Since the first-first PA 148 is supplied power via the first modulated switcher 60 and the first-second PA 150 is powered by the second modulated switcher 64, the FERA PA section 144 can at times be operated much more efficiently than FERA PA sections of the prior art. For instance, suppose the first-first PA 148 is required to amplify first-first signals to a 5 dBm power level, while the first-second PA 150 is required to amplify first-second signals to a 24 dBm power level. As a result, a higher voltage must be sourced by the second modulated switcher 64 to supply the 24 dBm power level required by the first-second PA 150 relative to the voltage that is needed to be sourced by the first modulated switcher 60 supplying the first-first PA 148. Therefore, a single power supply providing a single voltage output as taught by the prior art will force the first-first PA 148 to operate inefficiently due to the relatively higher voltage needed to supply the first-first PA 148. The improved configuration of FERA PA section 144 allows the first-first PA 148 to be operated at a voltage that is different than a voltage at which the first-second PA 150 is operated. It is to be understood that the first-first PA 148 and the first-second PA 150 can be operated at equal voltages in some instances and the first-first PA 148 can be operated at a higher power level than the first-second PA 150 in other instances.

Figure 14:
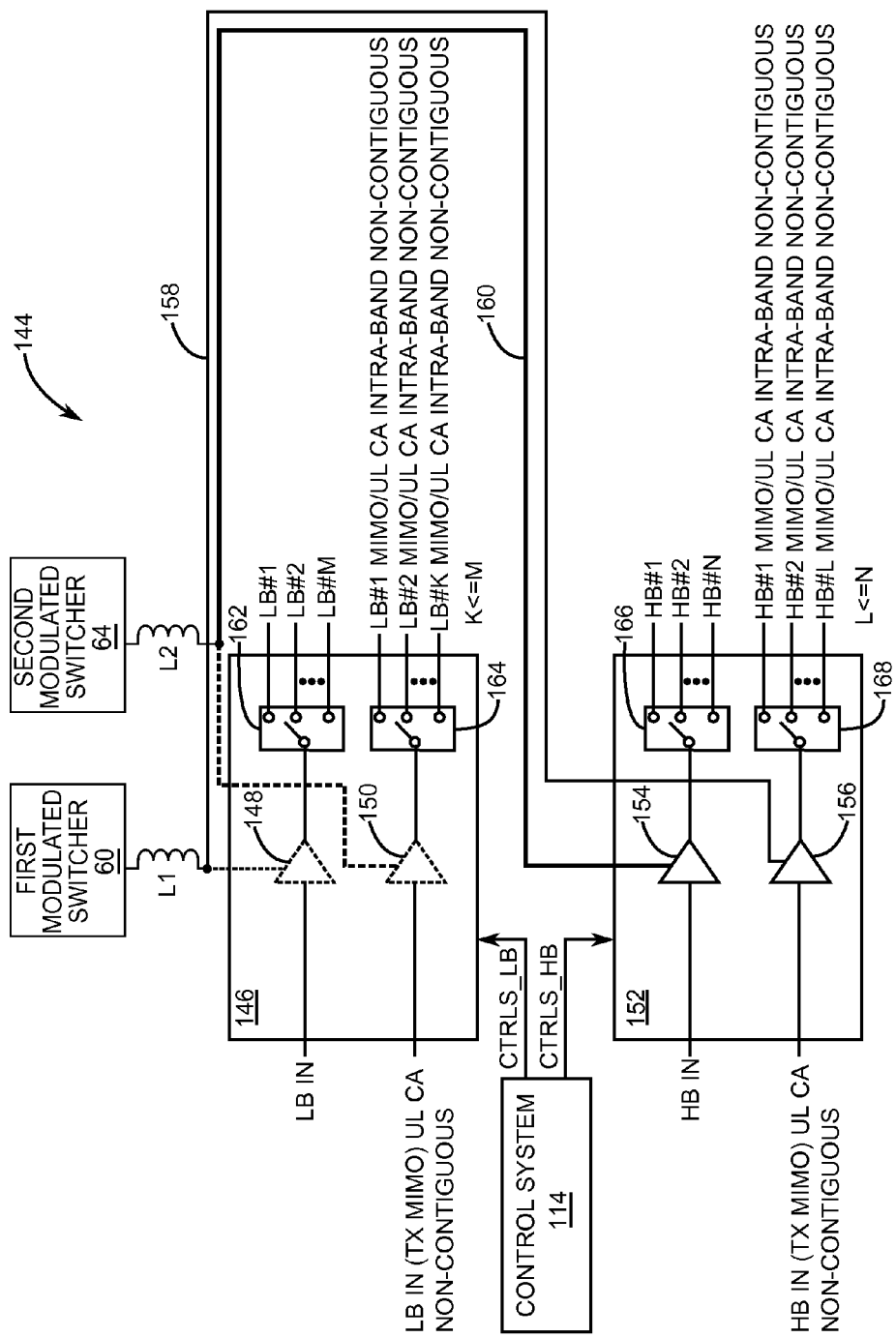
FIG. 14 is a schematic depicting operation of the exemplary FERA PA section in a second mode of operation for amplification of TX MIMO high band (HB) signals or UL CA HB intra-band non-contiguous signals or UL CA HB/HB signals.

FIG. 14 is a schematic that depicts operation of the FERA PA section 144 in a second mode of operation that allows amplification of second-first signals such as TX MIMO HB signals and second-second signals such as UL CA HB intra-band non-contiguous signals or UL CA HB/HB signals. In the second mode of operation, the control system 114 disables the first-first PA 148, disables the first-second PA 150, enables the second-first PA 154 to draw power from the second modulated switcher 64 via the second path 160, and enables the second-second PA 156 to draw separate power from the first modulated switcher 60 via the first path 158.

Figure 15:
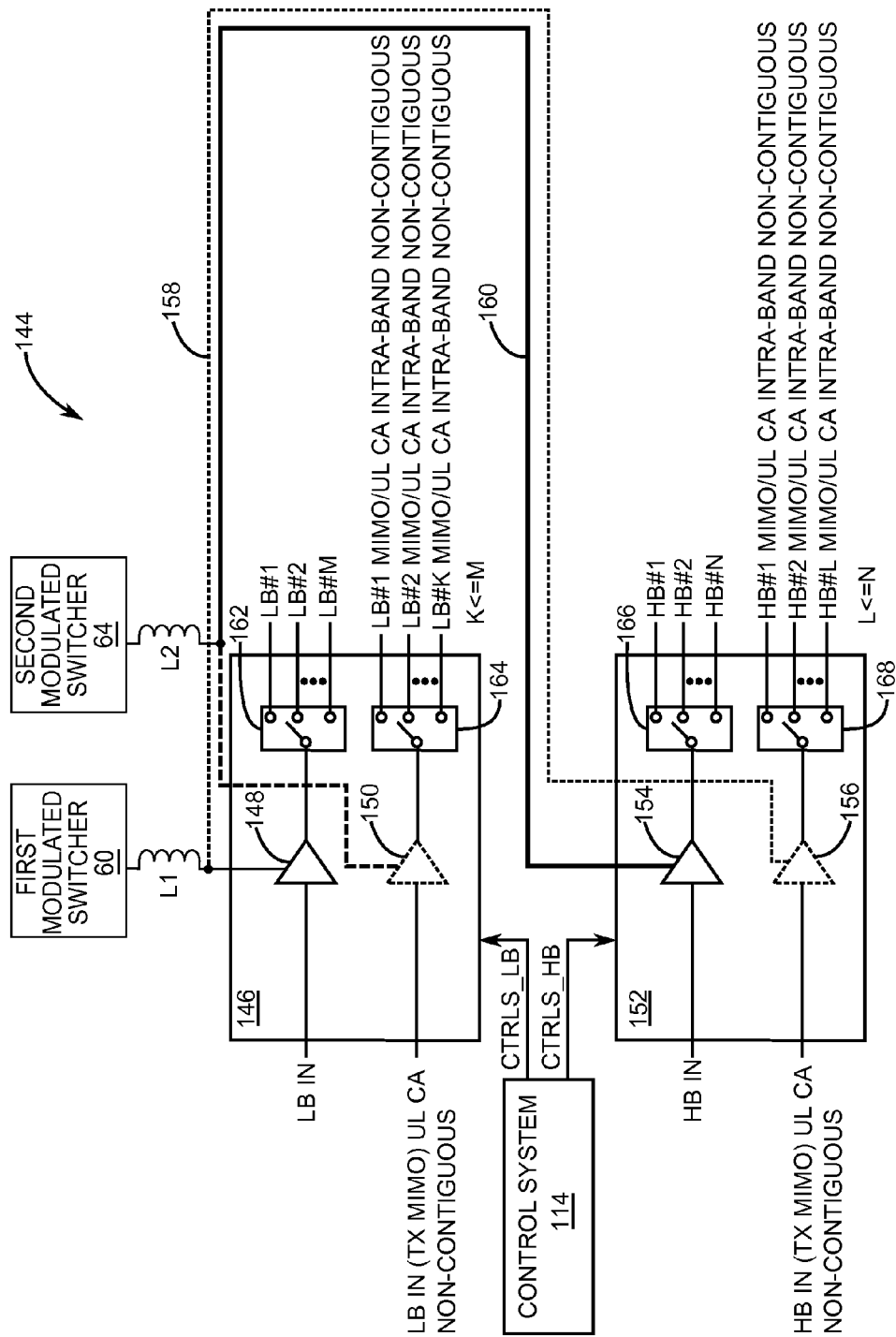
FIG. 15 is a schematic depicting operation of the exemplary FERA PA section in a third mode of operation for amplification of UL CA LB/HB signals.

FIG. 15 is a schematic that depicts operation of the FERA PA section 144 in a third mode of operation that allows amplification of first-first signals such as UL CA LB and second-first signals such as HB signals. In the third mode of operation, the control system 114 enables the first-first PA 148 to draw power from the first modulated switcher 60 via the first path 158, disables the first-second PA 150, enables the second-first PA 154 to draw separate power from the second modulated switcher 64 via the second path 160, and disables the second-second PA 156.

Figure 16:
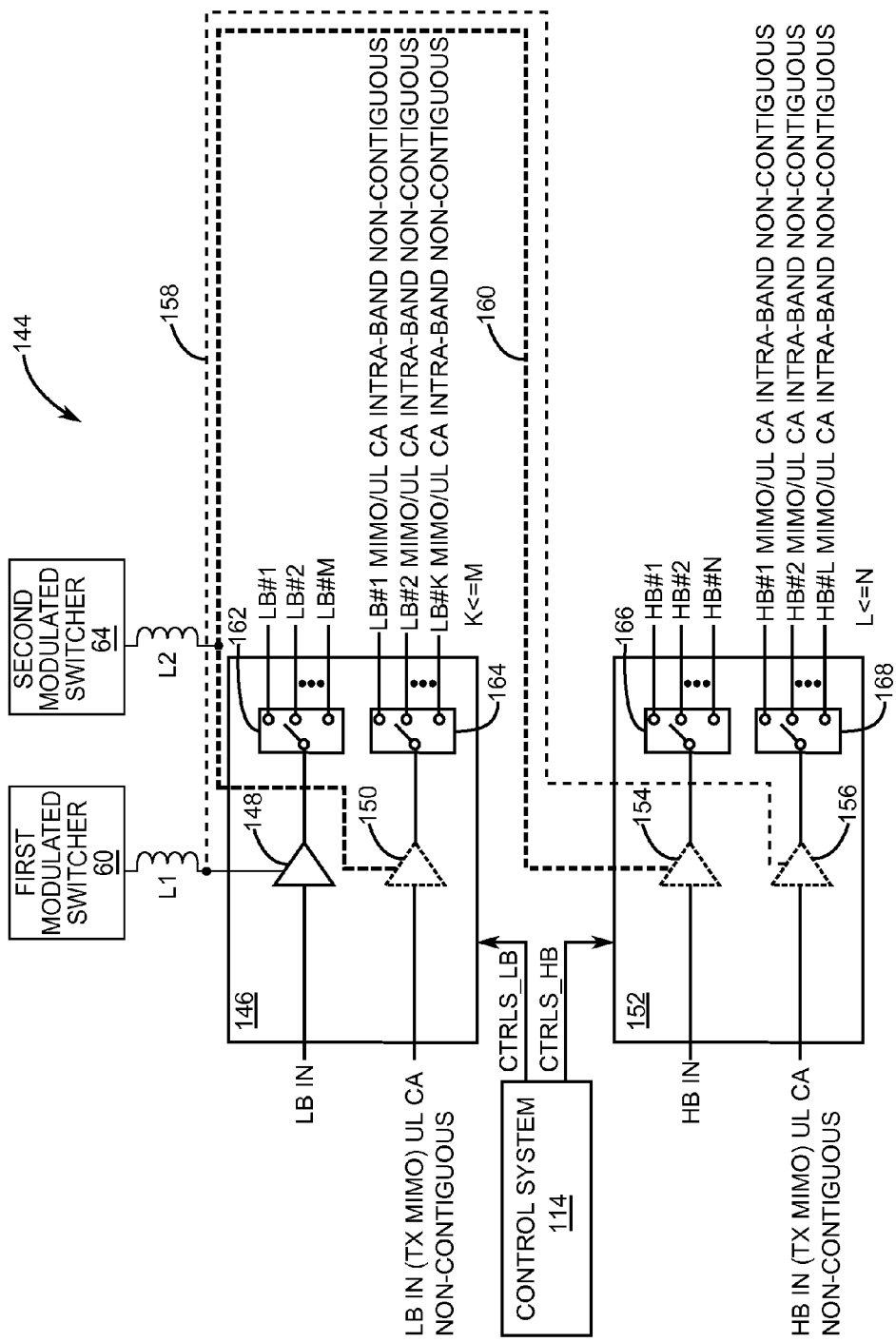
FIG. 16 is a schematic depicting operation of the exemplary FERA PA section in a fourth mode of operation for amplification of UL CA intra-band contiguous or non-CA for LB signals.

FIG. 16 is a schematic that depicts operation of the FERA PA section 144 in a fourth mode of operation that allows amplification of first-first signals such as UL CA intra-band contiguous or non-CA for LB signals that are input to the first-first PA 148. In the fourth mode of operation, the control system 114 enables the first-first PA 148 to draw power from the first modulated switcher 60 via the first path 158, disables the first-second PA 150, disables the second-first PA 154, and disables the second-second PA 156.

Figure 17:
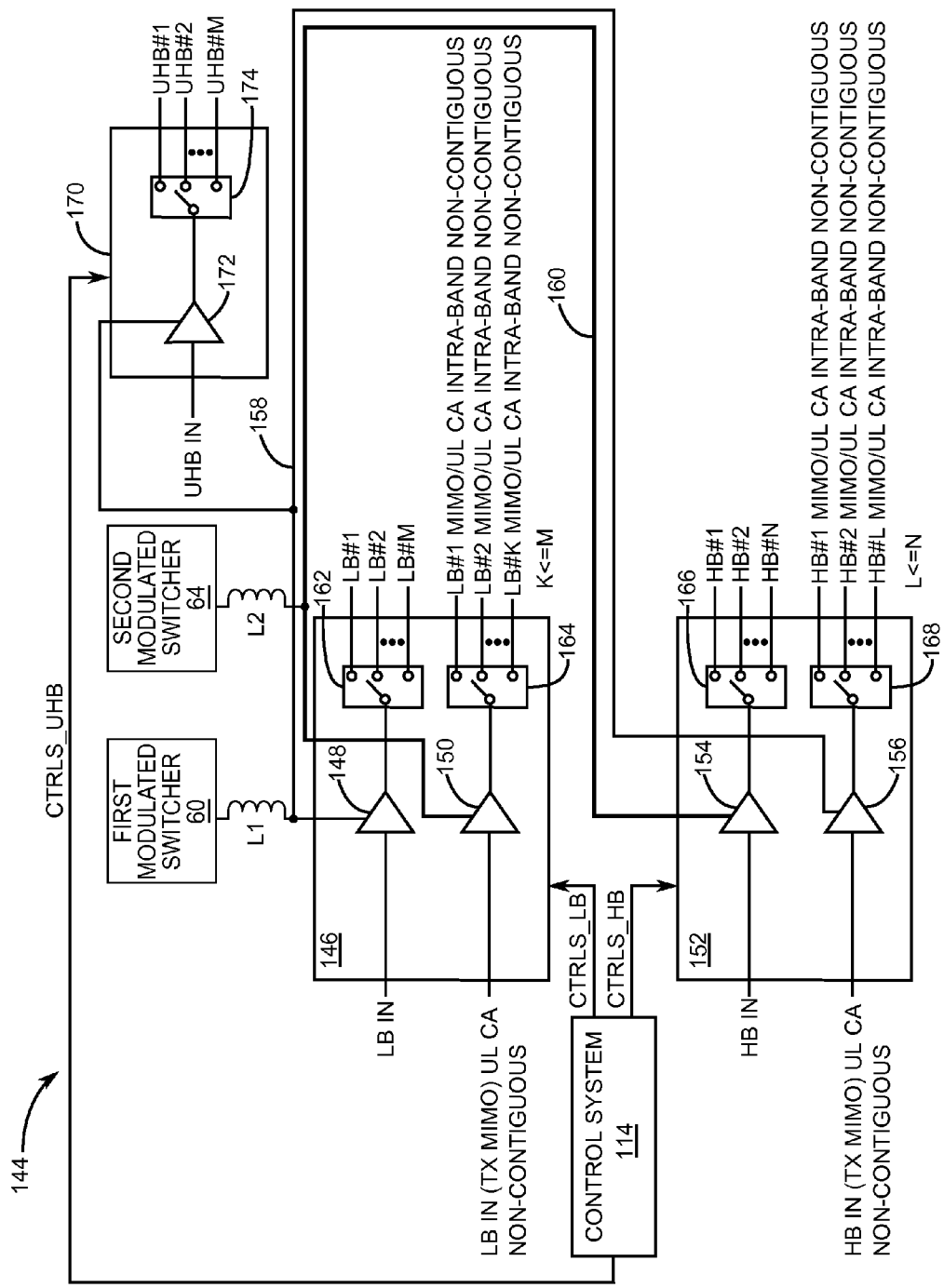
FIG. 17 is a schematic of the exemplary FERA PA section that further includes an ultrahigh band (UHB) PA.

FIG. 17 is a schematic of the FERA PA section 144 that further includes a satellite PA block 170 having a satellite PA 172. A satellite switch 174 is depicted integral with the satellite PA block 170 and is also controlled by a control signal CTRLS_UHB. In the exemplary embodiment shown in FIG. 17, the satellite PA block 170 is an ultrahigh band (UHB) PA block, and the satellite PA 172 is a UHB PA and the satellite switch 174 is a UHB switch. In a fifth mode of operation, the control system 114 enables the satellite PA 172 to draw power from the first modulated switcher 60 via the first path 158. In response, auxiliary signals such as UHB signals arriving at a UHB IN input are amplified by the satellite PA 172 before being selectively switched through the satellite switch 174 to one of M outputs. An example of spectrum use for the auxiliary signals ranges from 2300 MHz to 2790 MHz, which is a band that can be considered a high band.

Those skilled in the art will recognize improvements and modifications to the embodiments of the present disclosure. All such improvements and modifications are considered within the scope of the concepts disclosed herein and the claims that follow.

What is claimed is:
1. A front end radio architecture (FERA) with power management comprising:
    a first power amplifier (PA) block having a first-first PA for amplifying first-first signals and a first-second PA for amplifying first-second signals;

a second PA block having a second-first PA for amplifying second-first signals and a second-second PA for amplifying second-second signals;

at least one power supply adapted to selectively supply power to the first-first PA and the second-second PA through a first path, and to selectively supply power to the second-first PA and the first-second PA through a second path; and a control system adapted to selectively enable and disable the first-first PA, the first-second PA, the second-first PA, and the second-second PA in response to a selected mode of operation.

2. The FERA of claim 1 wherein the control system is further adapted during a first mode of operation to enable the first-first PA to draw power from the at least one power supply via the first path, enable the first-second PA to draw separate power from the at least one power supply via the second path, disable the second-first PA, and disable the second-second PA.

3. The FERA of claim 2 wherein the first PA block is a low band (LB) PA block and the first mode of operation includes amplification of TX MIMO LB signals.

4. The FERA of claim 2 wherein the first PA block is a low band (LB) PA block and the first mode of operation includes amplification of uplink (UL) carrier aggregation (CA) LB intra-band non-contiguous signals.

5. The FERA of claim 2 wherein the first PA block is a low band (LB) PA block, and the first mode of operation includes amplification of UL CA inter-band LB/LB signals.

6. The FERA of claim 1 wherein the control system is further adapted during a second mode of operation to disable the first-first PA, disable the first-second PA, enable the second-first PA to draw power from the at least one power supply via the second path, and enable the second-second PA to draw separate power from the at least one power supply via the first path.

7. The FERA of claim 6 wherein the second PA block is a high band (HB) PA block, and the second mode of operation includes amplification of TX MIMO HB signals.

8. The FERA of claim 6 wherein the second PA block is an HB PA block, and the second mode of operation includes amplification of UL CA HB intra-band non-contiguous signals.

9. The FERA of claim 6 wherein the second PA block is an HB PA block, and the second mode of operation includes amplification of UL CA HB/HB inter-band signals.

10. The FERA of claim 1 wherein the control system is further adapted during a third mode of operation to enable the first-first PA to draw power from the at least one power supply via the first path, disable the first-second PA, enable the second-first PA to draw separate power from the at least one power supply via the second path, and disable the second-second PA.

11. The FERA of claim 10 wherein the first PA block is an LB PA block, the second PA block is an HB block, and the third mode of operation includes amplification of UL CA inter-band LB/HB signals.

12. The FERA of claim 1 wherein the control system is further adapted during a fourth mode of operation to enable the first-first PA to draw power from the at least one power supply via the first path, disable the first-second PA, disable the second-first PA, and disable the second-second PA.

13. The FERA of claim 12 wherein the first PA block is an LB PA block, and the fourth mode of operation includes amplification of UL CA intra-band contiguous signals.

14. The FERA of claim 12 wherein the first PA block is an LB PA block, and the fourth mode of operation includes amplification of non-CA for the LB signals input into the first-first PA.

15. The FERA of claim 1 wherein the at least one power supply is further adapted to power a satellite PA block having at least one satellite PA.

16. The FERA of claim 15 wherein the control system is further adapted during a fifth mode of operation for amplification of auxiliary signals to selectively enable the at least one satellite PA to draw power from the at least one power supply via the first path.

17. The FERA of claim 1 wherein the first-first signals are amplified by the first-first PA before being selectively switched through a first-first switch to one of M outputs.

18. The FERA of claim 17 wherein the first-second signals are selectively switched through a first-second switch to one of K outputs.

19. The FERA of claim 18 wherein the K outputs are less than or equal to the M outputs.

20. The FERA of claim 1 wherein the second-second signals are amplified by the second-first PA before being selectively switched through a second-first switch to one of N outputs.

21. The FERA of claim 20 wherein the second-second signals are selectively switched through a second-second switch to one of L outputs.

22. The FERA of claim 21 wherein the L outputs are less than or equal to the N outputs.

* * * * *